United States Patent
Chung et al.

(10) Patent No.: US 10,074,572 B2
(45) Date of Patent: Sep. 11, 2018

(54) INTEGRATED CIRCUIT DEVICES AND METHODS OF MANUFACTURING THE SAME

(71) Applicant: Samsung Electronics Co., Ltd., Suwon-si, Gyeonggi-do (KR)

(72) Inventors: Jae-yup Chung, Yongin-si (KR); Yoon-seok Lee, Seoul (KR); Hyun-jo Kim, Seoul (KR); Hwa-sung Rhee, Seongnam-si (KR); Hee-don Jeong, Hwaseong-si (KR); Se-wan Park, Seoul (KR); Bo-cheol Jeong, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/491,303

(22) Filed: Apr. 19, 2017

(65) Prior Publication Data
US 2017/0221770 A1    Aug. 3, 2017

Related U.S. Application Data

(63) Continuation of application No. 14/965,982, filed on Dec. 11, 2015, now Pat. No. 9,673,330.

(30) Foreign Application Priority Data

Feb. 24, 2015 (KR) .................. 10-2015-0025919

(51) Int. Cl.
*H01L 21/8234* (2006.01)
*H01L 29/06* (2006.01)
(Continued)

(52) U.S. Cl.
CPC .. *H01L 21/823481* (2013.01); *H01L 21/8232* (2013.01); *H01L 21/823412* (2013.01);
(Continued)

(58) Field of Classification Search
CPC ............. H01L 21/8232; H01L 21/8234; H01L 21/823412; H01L 21/823431;
(Continued)

(56) References Cited

U.S. PATENT DOCUMENTS 6,417,070 B1   7/2002  Ballantine et al.
6,498,383 B2  12/2002  Beyer et al.
(Continued)

FOREIGN PATENT DOCUMENTS

JP   2004530304 (A)    9/2004
JP   2004311954       11/2004
(Continued)

*Primary Examiner* — Eduardo A Rodela
(74) *Attorney, Agent, or Firm* — Myers Bigel, P.A.

(57) ABSTRACT

An integrated circuit device includes first and second fin-type active regions having different conductive type channel regions, a first device isolation layer covering both sidewalls of the first fin-type active region, and a second device isolation layer covering both sidewalls of the second fin-type active region. The first device isolation layer and the second device isolation layer have different stack structures. To manufacture the integrated circuit device, the first device isolation layer covering both sidewalls of the first fin-type active region and the second device isolation layer covering both sidewalls of the second fin-type active region are formed after the first fin-type active region and the second fin-type active region are formed. The first device isolation layer and the second device isolation layer are formed to have different stack structure.

13 Claims, 49 Drawing Sheets

(51) Int. Cl.

| | |
|---|---|
| *H01L 27/092* | (2006.01) |
| *H01L 29/78* | (2006.01) |
| *H01L 29/10* | (2006.01) |
| *H01L 29/08* | (2006.01) |
| *H01L 29/417* | (2006.01) |
| *H01L 27/108* | (2006.01) |
| *H01L 21/8232* | (2006.01) |
| *H01L 21/8238* | (2006.01) |
| *H01L 27/088* | (2006.01) |

(52) U.S. Cl.
CPC ........ *H01L 21/823431* (2013.01); *H01L 21/823807* (2013.01); *H01L 21/823821* (2013.01); *H01L 21/823878* (2013.01); *H01L 27/0886* (2013.01); *H01L 27/0924* (2013.01); *H01L 27/10879* (2013.01); *H01L 29/0649* (2013.01); *H01L 29/0843* (2013.01); *H01L 29/1033* (2013.01); *H01L 29/41791* (2013.01); *H01L 29/785* (2013.01)

(58) Field of Classification Search
CPC ......... H01L 21/823821; H01L 21/845; H01L 27/0886; H01L 27/0924; H01L 27/10879; H01L 27/1211; H01L 29/41791; H01L 29/66772; H01L 29/66795; H01L 29/7831; H01L 29/785; H01L 29/786
See application file for complete search history.

(56) References Cited

U.S. PATENT DOCUMENTS

| | | | |
|---|---|---|---|
| 6,709,951 B2 | 3/2004 | Beyer et al. | |
| 6,764,922 B2 | 7/2004 | Beyer et al. | |
| 6,825,086 B2 | 11/2004 | Lee et al. | |
| 6,825,529 B2 | 11/2004 | Chidambarrao et al. | |
| 6,882,025 B2 * | 4/2005 | Yeo | H01L 21/76229 257/374 |
| 7,141,456 B2 | 11/2006 | Lee et al. | |
| 7,193,322 B2 | 3/2007 | Lee et al. | |
| 7,425,740 B2 * | 9/2008 | Liu | H01L 28/82 257/306 |
| 7,598,571 B2 | 10/2009 | Kim et al. | |
| 7,843,024 B2 | 11/2010 | Chidambarrao et al. | |
| 7,989,911 B1 | 8/2011 | Mehta et al. | |
| 8,467,233 B2 | 6/2013 | Yu et al. | |
| 8,546,242 B2 | 10/2013 | Chen et al. | |
| 8,815,742 B2 | 8/2014 | Cai et al. | |
| 8,835,262 B2 | 9/2014 | Cai et al. | |
| 2007/0148881 A1 * | 6/2007 | Tseng | H01L 21/76224 438/296 |
| 2010/0230757 A1 | 9/2010 | Chen et al. | |
| 2011/0068400 A1 * | 3/2011 | Wang | G11C 11/412 257/347 |
| 2013/0113026 A1 | 5/2013 | Huang et al. | |
| 2013/0234147 A1 | 9/2013 | Wu et al. | |
| 2014/0027816 A1 * | 1/2014 | Cea | H01L 29/66545 257/192 |
| 2014/0264719 A1 | 9/2014 | Chou et al. | |
| 2015/0187867 A1 | 7/2015 | Basker et al. | |
| 2016/0233298 A1 | 8/2016 | Webb et al. | |

FOREIGN PATENT DOCUMENTS

| | | |
|---|---|---|
| KR | 10-0419689 | 2/2004 |
| KR | 10-1364378 | 2/2014 |

* cited by examiner

2E – 2E'

INTEGRATED CIRCUIT DEVICES AND METHODS OF MANUFACTURING THE SAME

CROSS-REFERENCE TO RELATED APPLICATIONS

This application is a continuation of U.S. patent application Ser. No. 14/965,982, filed Dec. 11, 2015, which itself claims priority under 35 U.S.C. § 119 to Korean Patent Application No. 10-2015-0025919, filed on Feb. 24, 2015, in the Korean Intellectual Property Office, the disclosures of both of which are hereby incorporated in their entireties.

BACKGROUND

The inventive concepts relate to integrated circuit devices and methods of manufacturing the integrated circuit devices, and more particularly, to integrated circuit devices including a fin field effect transistor (FinFET) and methods of manufacturing the integrated circuit devices.

Owing to developments in electronic technology, semiconductor devices have recently rapidly down-scaled. Since semiconductor devices benefit from not only fast operation speed but also operation accuracy, much research into optimization of a structure of a transistor included therein is being conducted.

SUMMARY

The inventive concepts can provide integrated circuit devices for improving carrier mobility independently in channel regions having different conductive types.

The inventive concepts also can provide methods of manufacturing integrated circuit devices for improving carrier mobility independently in channel regions having different conductive types.

According to an aspect of the inventive concepts, integrated circuit devices can be provided including a first fin-type active region in a first region of a substrate, the first fin-type active region having a first conductive type channel region, a first device isolation layer covering both sidewalls of a lower portion of the first fin-type active region, a second fin-type active region in a second region of the substrate, the second fin-type active region having a second conductive type channel region, and a second device isolation layer covering both sidewalls of a lower portion of the second fin-type active region, wherein the first device isolation layer and the second device isolation layer have different stack structures.

The first fin-type active region may be defined by a first trench in the first region. The first device isolation layer may include a first insulating liner in contact with a sidewall of the first fin-type active region, wherein the first insulating liner is in the first trench, and a first gapfill insulating layer filling the first trench, wherein the first gapfill insulating layer is on the first insulating liner.

The first insulating liner may include a first oxide film, and the first gapfill insulating layer may include a second oxide film.

The second fin-type active region may be defined by a second trench in the second region. The second device isolation layer may include a second insulating liner in contact with a sidewall of the second fin-type active region, wherein the second insulating liner is in the second trench, a third insulating liner covering a sidewall of the second fin-type active region with the second insulating liner interposed therebetween, and a second gapfill insulating layer filling the second trench, wherein the second gapfill insulating layer is on the third insulating liner.

The second insulating liner may include a third oxide film, the third insulating liner may include a polysilicon film or a nitride film, and the second gapfill insulating layer may include a fourth oxide layer.

According to another aspect of the inventive concepts, integrated circuit devices can be provided including a pair of first fin-type active regions being lined up in a substantially straight line in a first region of a substrate, the pair of first fin-type active regions each having a first conductive type channel region, a low level first device isolation layer covering both sidewalls of a lower portion of each of the pair of first fin-type active regions, a high level first device isolation layer extending in a space between the pair of first fin-type active regions, a pair of second fin-type active regions being lined up in a substantially straight line in a second region of the substrate, the pair of second fin-type active regions each having a second conductive type channel region, a low level second device isolation layer covering both sidewalls of a lower portion of each of the pair of second fin-type active regions, and a high level second device isolation layer extending in a space between the pair of second fin-type active regions, wherein the low level first device isolation layer and the low level second device isolation layer have different stack structures, and the high level first device isolation layer and the high level second device isolation layer have different stack structures.

A first fin-type active region of the pair of first fin-type active regions may be defined by a first trench in the first region, and a second fin-type active region of the pair of second fin-type active regions may be defined by a second trench in the second region. The low level first device isolation layer may include a first insulating liner in contact with the first fin-type active region, and a first gapfill insulating layer filling the first trench, wherein the first gapfill insulating layer is on the first insulating liner. The low level second device isolation layer may include a second insulating liner in contact with the second fin-type active region, a third insulating liner covering a sidewall of the second fin-type active region with the second insulating liner interposed therebetween, and a second gapfill insulating layer filling the second trench, wherein the second gapfill insulating layer is on the third insulating liner.

The high level first device isolation layer may be in a first fin isolation region between the pair of first fin-type active regions, and the high level second device isolation layer may be in a second fin isolation region between the pair of second fin-type active region. The high level first device isolation layer may include a first insulating liner in contact with the pair of first fin-type active regions, a first gapfill insulating layer on the first insulating liner, and a first upper buried layer in contact with the first insulating liner and the first gapfill insulating layer, wherein the first upper buried layer is on the first gapfill insulating layer. The high level second device isolation layer may include a second insulating liner in contact with the pair of second fin-type active regions, a third insulating liner on the second insulating liner, a second gapfill insulating layer formed on the third insulating liner, and a second upper buried layer in contact with the second insulating liner, the third insulating liner, and the second gapfill insulating layer, wherein the second upper buried layer is on the second gapfill insulating layer.

The high level first device isolation layer may fill a first fin isolation trench between the pair of first fin-type active regions and may fill a first upper trench, wherein the first upper trench has a width larger than that of the first fin isolation trench, is on the first fin isolation trench, and communicates with the first fin isolation trench. The high level second device isolation layer may fill a second fin isolation trench between the pair of second fin-type active regions and may fill a second upper trench, wherein the second upper trench has a width larger than that of the second fin isolation trench, is on the second fin isolation trench, and communicates with the second fin isolation trench.

The high level first device isolation layer may include a first oxide film in contact with the pair of first fin-type active regions, wherein the first oxide film is in the first fin isolation trench, a second oxide film filling the first fin isolation trench, wherein the second oxide film is on the first oxide film, and a third oxide film in contact with the first oxide film and the second oxide film, wherein the third oxide film is in the first upper trench.

The third oxide film may have a width that is greater than that of the first fin isolation trench.

The high level second device isolation layer may include a fourth oxide film in contact with the pair of second fin-type active regions, wherein the fourth oxide film is in the second fin isolation trench, a fifth oxide film filling the second fin isolation trench, wherein the fifth oxide film is on the fourth oxide film, and an insulating liner interposed between the fourth oxide film and the fifth oxide film, wherein the insulating liner is in the second fin isolation trench and includes a material that is different from those of the fourth and fifth oxide films, and a sixth oxide film in contact with the fourth oxide film, the insulating liner, and the fifth oxide film, wherein the sixth oxide film is in the second upper trench.

The insulating liner may include a polysilicon film or a nitride film.

The sixth oxide film may have a width that is greater than that of the second fin isolation trench.

The low level first device isolation layer may have an upper surface at a level that is lower than that of an upper surface of each of the pair of first fin-type active regions, the low level second device isolation layer may have an upper surface at a level that is lower than that of an upper surface of each of the pair of second fin-type active regions, the high level first device isolation layer may have an upper surface at a level that is higher than that of the upper surface of each of the pair of first fin-type active regions, and the high level second device isolation layer may have an upper surface at a level that is higher than that of the upper surface of each of the pair of second fin-type active regions.

The low level first device isolation layer may have an upper surface at a level that is lower than that of an upper surface of each of the pair of first fin-type active regions, the low level second device isolation layer may have an upper surface at a level that is lower than that of an upper surface of each of the pair of second fin-type active regions, the high level first device isolation layer may have an upper surface at a level that is substantially the same as that of the upper surface of each of the pair of first fin-type active regions, and the high level second device isolation layer may have an upper surface at a level that is substantially the same as that of the upper surface of each of the pair of second fin-type active regions.

The integrated circuit device may further include a first normal gate on a first fin-type active region of the pair of first fin-type active regions, and extending in a direction intersecting with an extending direction of the pair of first fin-type active regions, and a first dummy gate on the high level first device isolation layer, and extending parallel to the at least one first normal gate.

The integrated circuit device may further include a source/drain region in at least one of the pair of first fin-type active regions, wherein the source/drain region is vertically overlapped by a portion of the high level first device isolation layer.

The integrated circuit device may further include a second normal gate on a second fin-type active region of the pair of second fin-type active regions, and extending in a direction intersecting with an extending direction of the pair of second fin-type active regions, and a second dummy gate on the high level second device isolation layer, and extending parallel to the at least one second normal gate.

The integrated circuit device may further include a source/drain region in at least one of the pair of second fin-type active regions, wherein the source/drain region is vertically overlapped by a portion of the high level second device isolation layer.

According to another aspect of the inventive concepts, methods of manufacturing integrated circuit devices may be provided, the methods including forming a first fin-type active region and a second fin-type active region, the first fin-type active region disposed in a first region of a substrate and having a first conductive type channel region, the second fin-type active region disposed in a second region of the substrate and having a second conductive type channel region, and forming a first device isolation layer and a second device isolation layer, the first device isolation layer covering both sidewalls of the first fin-type active region, the second device isolation layer covering both sidewalls of the second fin-type active region, wherein the first device isolation layer and the second device isolation layer are formed to have different stack structures.

The forming of the first device isolation layer and the second device isolation layer may include forming a first trench defining the first fin-type active region in the first region and a second trench defining the second fin-type active region in the second region, forming a first insulating liner and a second insulating liner, the first insulating liner contacting a sidewall of the first fin-type active region in the first trench, the second insulating liner contacting a sidewall of the second fin-type active region, in the second trench, forming a third insulating liner covering the second insulating liner in the second trench in the second region, and forming a first gapfill insulating layer and a second gapfill insulating layer, the first gapfill insulating layer filling the first trench on the first insulating liner, the second gapfill insulating layer filling the second trench on the third insulating liner.

The forming of the first insulating liner and the second insulating liner may be performed by using an in-situ steam generation (ISSG) process, a thermal oxidation process, an ultraviolet (UV) oxidation process, or an $O_2$ plasma oxidation process, and the forming of the first gapfill insulating layer and the second gapfill insulating layer may be performed by using a flowable chemical vapor deposition (FCVD) process or a spin coating process.

Each of the first and second insulating liners may include an oxide film, and the third insulating liner may include a polysilicon film or a nitride film.

According to another aspect of the inventive concepts, methods of manufacturing integrated circuit devices may be provided, the methods including forming a pair of first fin-type active regions and a pair of second fin-type active regions, the pair of first fin-type active regions being lined up in a substantially straight line along a first direction in a first region of a substrate and having a first conductive type channel region, the pair of second fin-type active regions being lined up in a substantially straight line along the first direction in a second region of the substrate and having a second conductive type channel region, forming a low level first device isolation layer and a low level second device isolation layer, the low level first device isolation layer covering both sidewalls of a lower portion of each of the pair of first fin-type active regions, the low level second device isolation layer covering both sidewalls of a lower portion of each of the pair of second fin-type active regions, wherein the low level first device isolation layer and the low level second device isolation layer have different stack structures, and forming a high level first device isolation layer and a high level second device isolation layer, the high level first device isolation layer extending in a space between the pair of first fin-type active regions, the high level second device isolation layer extending in a space between the pair of second fin-type active regions, wherein the high level first device isolation layer and the high level second device isolation layer have different stack structures.

The forming of the low level first device isolation layer and the low level second device isolation layer may include forming a first trench extending in the first direction in the first region and a second trench extending in the first direction in the second region, forming a first insulating liner and a second insulating liner, the first insulating liner contacting a sidewall of each of the pair of first fin-type active regions in the first trench, the second insulating liner contacting a sidewall of each of the pair of second fin-type active regions in the second trench, forming a third insulating liner covering the second insulating liner in the second trench, and forming a first gapfill insulating layer on the first insulating liner and a second gapfill insulating layer on the third insulating liner, the first gapfill insulating layer filling the first trench, the second gapfill insulating layer filling the second trench.

The forming of the high level first device isolation layer and the high level second device isolation layer may include forming a first fin isolation trench and a second fin isolation trench, the first fin isolation trench extending in a second direction intersecting the first direction in the first region, the second fin isolation trench extending in the second direction in the second region, forming a first insulating liner and a second insulating liner, the first insulating liner contacting each of the pair of first fin-type active regions in the first fin isolation trench, the second insulating liner contacting each of the pair of second fin-type active regions in the second fin isolation trench, forming a third insulating liner covering the second insulating liner in the second fin isolation trench, and forming a first gapfill insulating layer on the first insulating liner and a second gapfill insulating layer on the third insulating liner, the first gapfill insulating layer filling the first fin isolation trench, the second gapfill insulating layer filling the second fin isolation trench, forming a first upper trench, which communicates with the first fin isolation trench and has a bottom at a level which is lower than those of upper surfaces of the pair of first fin-type active regions, by removing a portion of each of the pair of first fin-type active regions, forming a second upper trench, which communicates with the second fin isolation trench and has a bottom at a level which is lower than those of upper surfaces of the pair of second fin-type active regions, by removing a portion of each of the pair of second fin-type active regions, and forming a first upper buried layer filling the first upper trench and a second upper buried layer filling the second upper trench.

The first upper buried layer may be formed to have an upper surface at a level that is higher than the upper surfaces of the pair of first fin-type active regions, and the second upper buried layer may be formed to have an upper surface at a level that is higher than the upper surfaces of the pair of second fin-type active regions.

The forming of the first insulating liner and the second insulating liner may include forming an oxide film, and the forming of the third insulating liner may include forming a polysilicon film or a nitride film.

The method may further include forming at least one first normal gate on a first fin-type active region of the pair of first fin-type active regions and a first dummy gate on the high level first device isolation layer, the at least one first normal gate extending in a direction intersecting with an extending direction of the pair of first fin-type active regions, the first dummy gate extending parallel to the at least one first normal gate.

The method may further include forming at least one second normal gate on a second fin-type active region of the pair of second fin-type active regions and a second dummy gate on the high level second device isolation layer, the at least one second normal gate extending in a direction intersecting with an extending direction of the pair of second fin-type active regions, the second dummy gate extending parallel to the at least one second normal gate.

According to another aspect of the inventive concepts, integrated circuit devices can be provided including a substrate including a first region and a second region, a plurality of first fin-type active regions in the first region and extending in a first direction, and a plurality of second fin-type active regions in the second region and extending in the first direction. The first region and the second region may have different conductivity types from one another. Adjacent first fin-type active regions of the plurality of first fin-type active regions may be separated by respective first trenches, wherein the first trench is filled with a first stack comprising a first insulating liner and a first gapfill insulating layer, and wherein the first insulating liner conformally covers the first trench and the first gapfill insulating layer covers the first insulating liner. Adjacent second fin-type active regions of the plurality of second fin-type active regions may be separated by respective second trenches, wherein the second trench is filled with a second stack comprising a second insulating liner, a third insulating liner and a second gapfill insulating layer, and wherein the second insulating liner conformally covers the second trench, the third insulating liner covers the second insulating liner and the second gapfill insulating layer covers the third insulating liner.

The integrated circuit device may further include a third trench in the first region extending in a second direction perpendicular to the first direction and intersecting individual ones of the plurality of first fin-type active regions, a fourth trench in the first region extending in the second direction and above the third trench, a fifth trench in the second region extending in the second direction and intersecting individual ones of the plurality of second fin-type active regions, and a sixth trench in the second region extending in the second direction and above the fifth trench. The third trench may have a depth substantially the same as a level of bottoms of the plurality of first fin-type active regions. A depth of the fourth trench may be less than the depth of the third trench. A width of the fourth trench may be greater than a width of the third trench. The fifth trench may have a depth substantially the same as a level of bottoms of the plurality of second fin-type active regions. A depth of the sixth trench may be less than the depth of the fifth trench. A width of the sixth trench may be greater than a width of the fifth trench. The third trench may be filled with a third stack comprising the first insulating liner and the first gapfill insulating layer, wherein the first insulating liner conformally covers the third trench and the first gapfill insulating layer covers the first insulating liner. The fourth trench may be filled with a first buried layer above, and in contact with, the first insulating liner and the first gapfill insulating layer. The fifth trench may be filled with a fourth stack comprising the second insulating liner, the third insulating liner and the second gapfill insulating layer, wherein the second insulating liner conformally covers the fifth trench, the third insulating liner covers the second insulating liner and the second gapfill insulating layer covers the third insulating liner. The sixth trench may be filled with a second buried layer above, and in contact with, the second insulating liner, the third insulating liner, and the second gapfill insulating layer.

A level of an upper surface of the first buried layer may be substantially the same as upper surfaces of the plurality of first fin-type active regions. A level of an upper surface of the second buried layer may be substantially the same as upper surfaces of the plurality of second fin-type active regions.

A level of an upper surface of the first buried layer may be above upper surfaces of the plurality of first fin-type active regions. A level of an upper surface of the second buried layer may be above upper surfaces of the plurality of second fin-type active regions.

The integrated circuit device may further include a first source/drain region in a first one of the plurality of first fin-type active regions and a second source/drain region in a second one of the plurality of second fin-type active regions. The first source/drain region may contact the first insulating layer and the first buried layer. An upper surface of the first source/drain region may be above the level of the upper surface of the first buried layer. The second source/drain region may contact the second insulating liner and the second buried layer. AN upper surface of the second source/drain region may be above the level of the upper surface of the second buried layer.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Figure 1A:
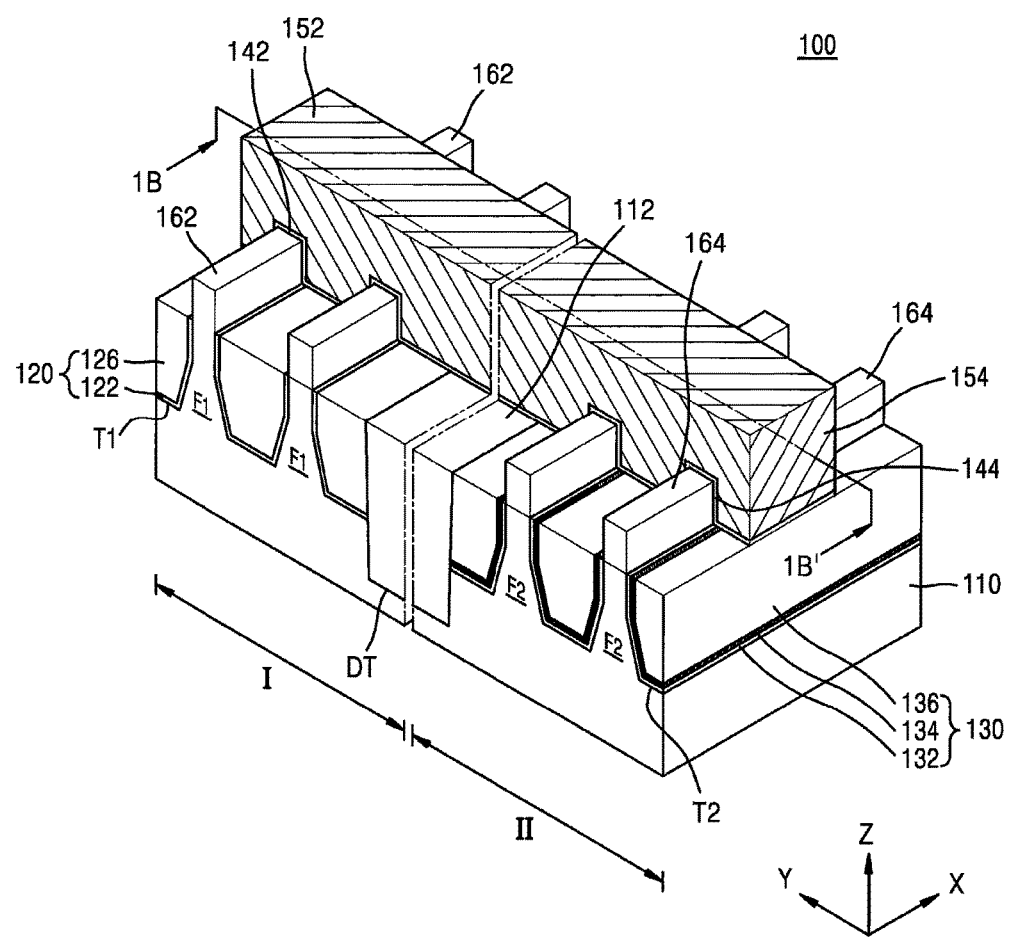
FIGS. 1A and 1B are diagrams of integrated circuit devices according to an example embodiment of the inventive concepts.

Hereinafter, example embodiments of the inventive concepts will be described in detail with reference to the accompanying drawings. Like reference numerals in the drawings denote like elements, and thus their redundant description will be omitted.

The inventive concepts will now be described more fully with reference to the accompanying drawings, in which example embodiments of the inventive concepts are shown. The inventive concepts may, however, be embodied in many different forms and should not be construed as being limited to the example embodiments set forth herein; rather, these example embodiments are provided so that this disclosure will be thorough and complete, and will fully convey the inventive concepts to those of ordinary skill in the art.

It will be understood that although the terms "first", "second", etc. are used herein to describe members, regions, layers, portions, sections, components, and/or elements in example embodiments of the inventive concepts, the members, regions, layers, portions, sections, components, and/or elements should not be limited by these terms. These terms are only used to distinguish one member, region, portion, section, component, or element from another member, region, portion, section, component, or element. Thus, a first member, region, portion, section, component, or element described below may also be referred to as a second member, region, portion, section, component, or element without departing from the scope of the inventive concepts. For example, a first element may also be referred to as a second element, and similarly, a second element may also be referred to as a first element, without departing from the scope of the inventive concepts.

Spatially relative terms, such as "beneath," "below," "lower," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by those of ordinary skill in the art to which the inventive concepts pertain. It will also be understood that terms, such as those defined in commonly used dictionaries, should be interpreted as having a meaning that is consistent with their meaning in the context of this specification and the relevant art and will not be interpreted in an idealized or overly formal sense unless expressly so defined herein.

When a certain example embodiment may be implemented differently, a specific process order may be performed differently from the described order. For example, two consecutively described processes may be performed substantially at the same time or performed in an order opposite to the described order.

In the accompanying drawings, variations from the illustrated shapes as a result, for example, of manufacturing techniques and/or tolerances, are to be expected. Thus, the example embodiments of the inventive concepts should not be construed as being limited to the particular shapes of regions illustrated herein but may be construed to include deviations in shapes that result, for example, from a manufacturing process. For example, an etched region illustrated as a rectangular shape may be a rounded or certain curvature shape. Thus, the regions illustrated in the figures are schematic in nature, and the shapes of the regions illustrated in the figures are intended to illustrate particular shapes of regions of devices and not intended to limit the scope of the present inventive concepts. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

Figure 1B:
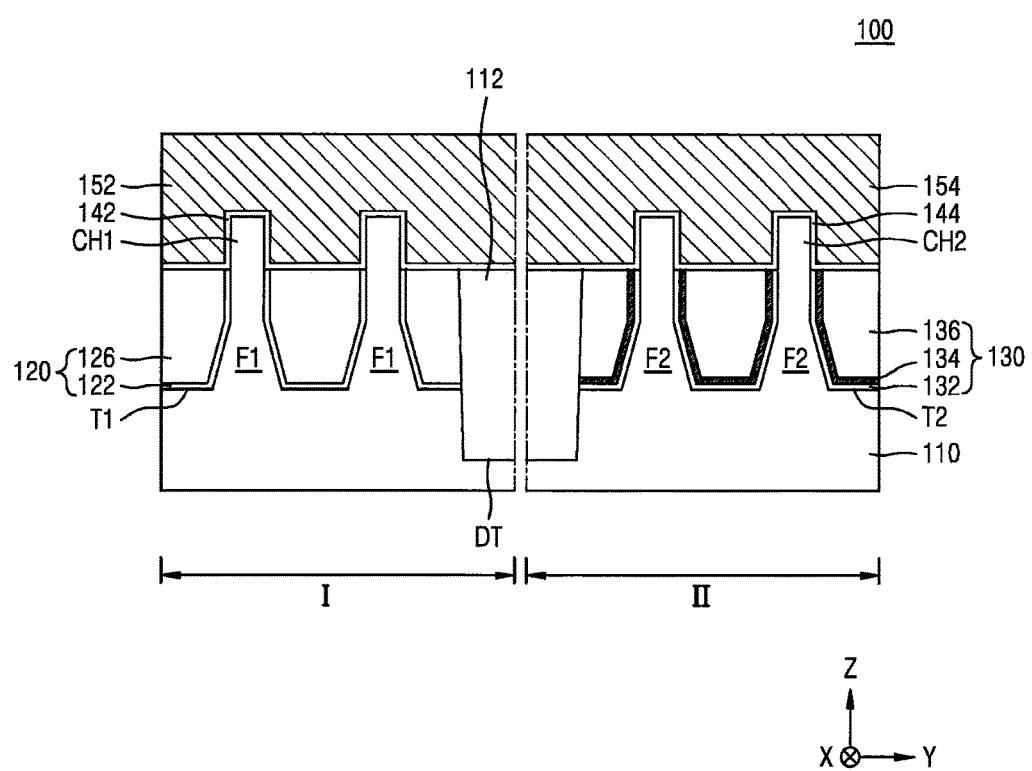

FIGS. 1A and 1B are diagrams of an integrated circuit device 100 according to an example embodiment of the inventive concepts. FIG. 1A is a perspective view of the integrated circuit device 100, and FIG. 1B is a cross-sectional view taken along a line 1B-1B' of FIG. 1A.

Referring to FIGS. 1A and 1B, the integrated circuit device 100 includes a substrate 110 including a first region I and a second region II. The substrate 110 may include a semiconductor, such as Si or Ge, or a compound semiconductor, such as SiGe, SiC, GaAs, InAs, or InP. In another example, the substrate 110 may have a silicon on insulator (SOI) structure. The substrate 110 may include a conductive region, for example, a well doped with impurities or a structure doped with impurities.

The first region I and the second region II of the substrate 110 refer to different regions of the substrate 110 and may be regions requiring different threshold voltages. For example, the first region I may be an N-type metal oxide semiconductor (NMOS) region, and the second region II may be a P-type metal oxide semiconductor (PMOS) region.

A plurality of first fin-type active regions F1 protrude from the substrate 110 in the first region I of the substrate 110 toward a direction (Z direction) perpendicular to a main surface of the substrate 110. Each of the plurality of first fin-type active regions F1 may have a first conductive type channel region CH1. Both sidewalls of each of the plurality of first fin-type active regions F1 may be covered with a first device isolation layer 120 under the first conductive type channel region CH1.

A plurality of second fin-type active regions F2 protrude from the substrate 110 in the second region II of the substrate 110 toward the direction (Z direction) perpendicular to the main surface of the substrate 110. Each of the plurality of second fin-type active regions F2 may have a second conductive type channel region CH2. Both sidewalls of each of the plurality of second fin-type active regions F2 may be covered with a second device isolation layer 130 under the second conductive type channel region CH2.

In FIGS. 1A and 1B, although two first fin-type active regions F1 are formed in the first region I and two second fin-type active regions F2 are formed in the second region II, the inventive concepts are not limited thereto. For example, one fin-type active region or three or more fin-type active regions may be formed in each of the first and second regions I and II.

The first device isolation layer 120 and the second device isolation layer 130 have different stack structures.

The first device isolation layer 120 may be formed to fill at least a portion of a first trench T1 defining the first fin-type active region F1. The first device isolation layer 120 may include a first insulating liner 122 and a first gapfill insulating layer 126, stacked sequentially from an inside wall of the first trench T1. The first insulating liner 122 may be formed to contact the sidewall of the first fin-type active region F1. The first gapfill insulating layer 126 may cover the sidewall of the first fin-type active region F1 with the first insulating liner 122 interposed therebetween and fill the inside of the first trench T1.

The first insulating liner 122 may be formed of a first oxide film, and the first gapfill insulating layer 126 may be formed of a second oxide film. The first oxide film and the second oxide film may be different oxide films that are obtained by using different methods.

In some embodiments, the first insulating liner 122 may be obtained by performing a process of oxidizing a surface of the first fin-type active region F1. For example, the first oxide film forming the first insulating liner 122 may be formed by using an in-situ steam generation (ISSG) process, a thermal oxidation process, an ultraviolet (UV) oxidation process, or an $O_2$ plasma oxidation process. In some embodiments, the first insulating liner 122 may have a thickness of about 10 Å to about 100 Å.

In some embodiments, the second oxide film forming the first gapfill insulating layer 126 may be a film formed by a deposition process or a coating process. In some embodiments, the first gapfill insulating layer 126 may be an oxide film formed by a flowable chemical vapor deposition (FCVD) process or a spin coating process. For example, the first gapfill insulating layer 126 may be formed of fluoride silicate glass (FSG), undoped silicate glass (USG), borophospho-silicate glass (BPSG), phospho-silicate glass (PSG), flowable oxide (FOX), plasma enhanced tetra-ethyl-ortho-silicate (PE-TEOS), or tonen silazene (TOSZ), but is not limited thereto.

The second device isolation layer 130 may be formed to fill at least a portion of a second trench T2 defining the second fin-type active region F2. The second device isolation layer 130 may include a second insulating liner 132, a third insulating liner 134, and a second gapfill insulating layer 136, stacked sequentially from an inside wall of the second trench T2. The second insulating liner 132 may be formed to contact a sidewall of the second fin-type active region F2. The third insulating liner 134 may be formed to cover the sidewall of the second fin-type active region F2 with the second insulating liner 132 interposed therebetween. The second gapfill insulating layer 136 may be formed to cover the sidewall of the second fin-type active region F2 with the second and third insulating liners 132 and 134 interposed therebetween. The second insulating liner 132 may be formed of a third oxide film. The third insulating liner 134 may be formed of a polysilicon film or a nitride film. The second gapfill insulating layer 136 may be formed of a fourth oxide film.

The third oxide film forming the second insulating liner 132 may be obtained by performing a process of oxidizing a surface of the second fin-type active region F2. For example, the third oxide film forming the second insulating liner 132 may be formed by using an ISSG process, a thermal oxidation process, a UV oxidation process, or an $O_2$ plasma oxidation process. In some embodiments, the third oxide film forming the second insulating liner 132 may be the same material film formed by the same or similar process as the first oxide film forming the first insulating liner 122. In some embodiments, the second insulating liner 132 may have a thickness of about 10 Å to about 100 Å.

The third insulating liner 134 may play a role in improving carrier mobility in the second conductive type channel region CH2 by introducing a stress to the second conductive type channel region CH2 of the second fin-type active region F2. For example, when the second conductive type channel region CH2 forms a portion of a PMOS device, a compressive stress may be introduced to the second conductive type channel region CH2 by the third insulating liner 134. In some embodiments, the third insulating liner 134 may have a thickness of about 10 Å to about 100 Å.

In some embodiments, the fourth oxide film forming the second gapfill insulating layer 136 may be a film formed by a deposition process or a coating process. In some embodiments, the second gapfill insulating layer 136 may be an oxide film formed by a FCVD process or a coating process. For example, the second gapfill insulating layer 136 may be formed of FSG, USG, BPSG, PSG, FOX, PE-TEOS, or TOSZ. In some embodiments, the fourth oxide film forming the second gapfill insulating layer 136 may be the same material film formed by the same or similar process as the second oxide film forming the first gapfill insulating layer 126.

In the first region I of the substrate 110, a first gate insulating film 142 and a first gate 152, which cover both sidewalls and an upper surface of each of the plurality of first fin-type active regions F1, may be formed on the plurality of first fin-type active regions F1 and the first device isolation layer 120. The first gate insulating film 142 and the first gate 152 may extend in a direction (Y direction) intersecting with an extending direction (X direction) of the plurality of first fin-type active regions F1.

A deep trench DT having a depth that is larger than that of each of the first and second trenches T1 and T2 may be formed in the first and second regions I and II of the substrate 110. In some embodiments, the deep trench DT may be formed in an edge region of each of the first and second regions I and II or a region between the first region I and the second region II.

The inside of the deep trench DT may be filled with an insulating layer 112 for device region isolation. The insulating layer 112 for device region isolation may be formed of a fifth oxide film In some embodiments, the fifth oxide film is a film which may be formed by a coating process or a deposition process and may be formed of a material that is different from those of the first and second gapfill insulating layers 126 and 136. For example, the second and fourth oxide films, which form the first and second gapfill insulating layers 126 and 136, respectively, may be formed of FSG, and the fifth oxide film forming the insulating layer 112 for device region isolation may be formed of USG.

In the second region II of the substrate 110, a second gate insulating film 144 and a second gate 154, which cover both sidewalls and an upper surface of each of the plurality of second fin-type active regions F2, may be formed on the plurality of second fin-type active regions F2 and the second device isolation layer 130. The second gate insulating film 144 and the second gate 154 may extend in a direction (Y direction) intersecting with an extending direction (X direction) of the plurality of second fin-type active regions F2.

In FIG. 1A, although the first and second gate insulating films 142 and 144 cover bottoms of the first and second gates 152 and 154, respectively, the inventive concepts are not limited thereto. For example, the first and second gate insulating films 142 and 144 may cover bottoms and sidewalls of the first and second gates 152 and 154, respectively.

Each of the first and second gate insulating films 142 and 144 may be a silicon oxide film, a high dielectric film, or a combination thereof. The high dielectric film may be formed of a material having a dielectric constant that is greater than that of the silicon oxide film. For example, each of the first and second gate insulating films 142 and 144 may have a dielectric constant of about 10 to about 25. The high dielectric film may be formed of one selected from hafnium oxide, hafnium oxynitride, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and a combination thereof, but is not limited thereto. The first and second gate insulating films 142 and 144 may be formed by an atomic layer deposition (ALD) process, a chemical vapor deposition (CVD) process, or a physical vapor deposition (PVD) process. In some embodiments, the first gate insulating film 142 and the second gate insulating film 144 may have the same or similar structure. In some other embodiments, the first gate insulating film 142 and the second gate insulating film 144 may have different structures.

Each of the first and second gates 152 and 154 may include a metal-containing layer for work function adjustment and a metal-containing layer for gap-fill which fills a gate space remaining on the metal-containing layer for work function adjustment. In some embodiments, each of the first and second gates 152 and 154 may have a structure in which a metal nitride layer, a metal layer, a conductive capping layer, and a gap-fill metal film may be sequentially stacked. The metal nitride layer and the metal layer may respectively include at least one selected from Ti, W, Ru, Nb, Mo, Hf, Ni, Co, Pt, Yb, Tb, Dy, Er, and Pd. The metal nitride layer and the metal layer may be formed by an ALD process, a metal organic ALD (MOALD) process, or a metal organic CVD (MOCVD) process. The conductive capping layer may function as a protective layer for preventing a surface of the metal layer from being oxidized. Also, the conductive capping layer may function as a wetting layer for facilitating deposition when another conductive layer is deposited on the metal layer. The conductive capping layer may be formed of a metal nitride, for example, TiN, TaN, or a combination thereof, but is not limited thereto. The gap-fill metal film may extend on the conductive capping layer. The gap-fill metal film may be a tungsten (W) film. The gap-fill metal film may be formed by an ALD process, a CVD process, or a PVD process. The gap-fill metal film may fill a recess space, formed by a stepped portion in an upper surface of the conductive capping layer, without a void. In some embodiments, the first gate 152 and the second gate 154 may have different structures.

In the first region I of the substrate 110, a first source/drain region 162 may be formed, at both sides of the first gate 152, in the first fin-type active region F1. In the second region II of the substrate 110, a second source/drain region 164 may be formed, at both sides of the second gate 154, in the second fin-type active region F2.

In some embodiments, the first source/drain region 162 may include a semiconductor layer epitaxially grown from the first fin-type active region F1, and the second source/drain region 164 may include a semiconductor layer epitaxially grown from the second fin-type active region F2. Each of the first and second source/drain regions 162 and 164 may have an embedded SiGe structure including a plurality of epitaxially grown SiGe layers or may be formed of an epitaxially grown Si layer or an epitaxially grown SiC layer. The first source/drain region 162 and the second source/drain region 164 may have different structures.

In the integrated circuit device 100 described with reference to FIGS. 1A and 1B, the second device isolation layer 130 in the second region II includes the third insulating liner 134, whereas the first device isolation layer 120 in the first region I does not include the third insulating liner 134. Accordingly, in the first device isolation layer 120, the first insulating liner 122 may directly contact the first gapfill insulating layer 126, and the first gapfill insulating layer 126 may be disposed in a position relatively adjacent to the first fin-type active region F1 with the first insulating liner 122 interposed therebetween. Accordingly, when the first gapfill insulating layer 126 is heat-treated in subsequent various processes after the first gapfill insulating layer 126 is formed, a stress that is caused due to shrinkage of the first gapfill insulating layer 126 may be transmitted to the first fin-type active region F1 and thus a tensile stress may be applied to the first conductive type channel region CH1 of the first fin-type active region F1. As a result, when an NMOS transistor is implemented in the first region I, the performance of the NMOS transistor may be improved.

As the second device isolation layer 130 formed in the second region II includes the third insulating liner 134 that functions as a barrier between the second insulating liner 132 and the second gapfill insulating layer 136, a tensile stress, which may be caused in the second conductive type channel region CH2 of the second fin-type active region F2 due to the second gapfill insulating layer 136, may be minimized by the third insulating liner 134. By forming the third insulating liner 134 by using polysilicon or nitride, a compression stress may be introduced in the second conductive type channel region CH2 by using the third insulating liner 134 in the second region II. Accordingly, carrier mobility in the second conductive type channel region CH2 may be improved.

Figure 2A:
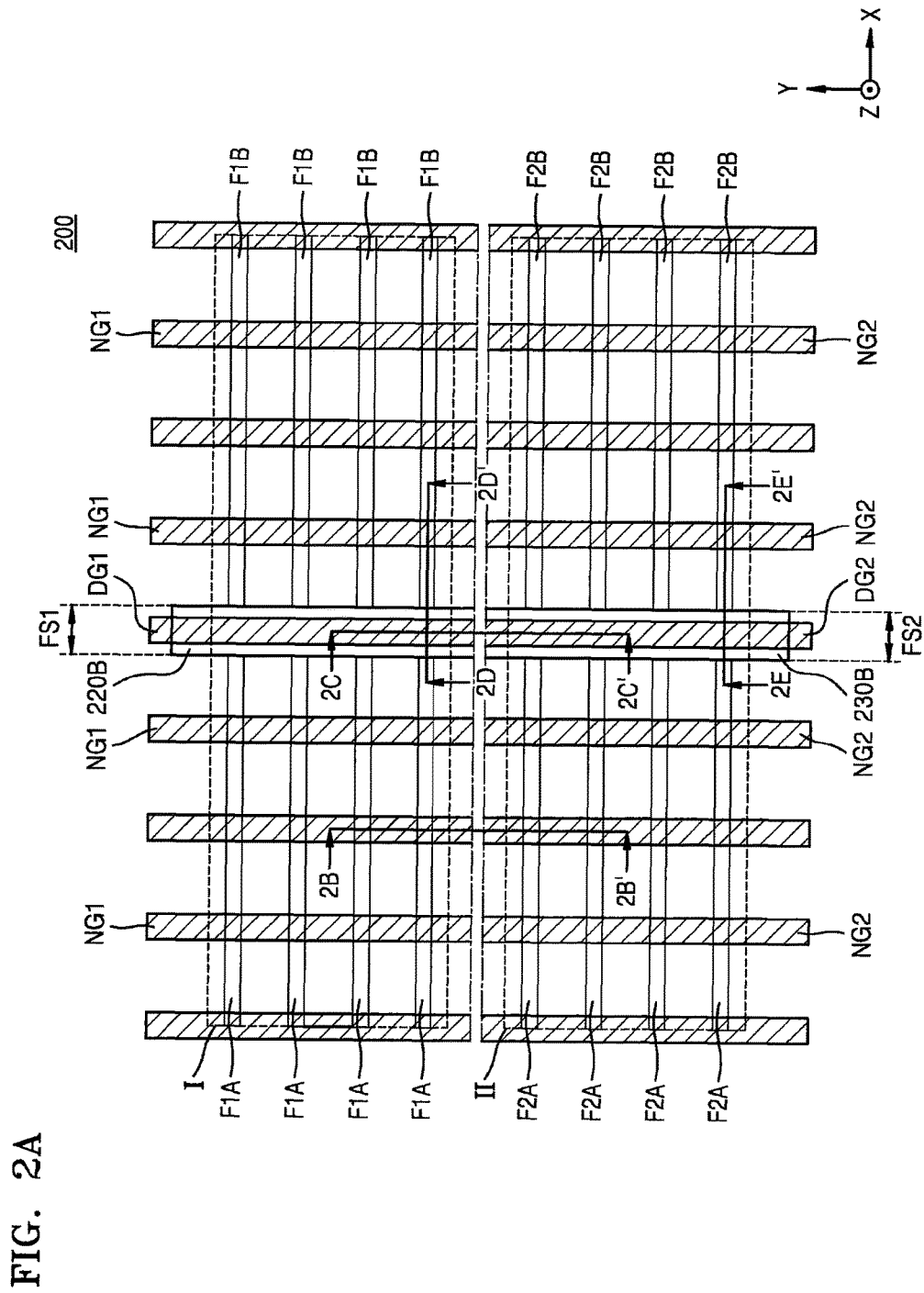
FIGS. 2A through 2E are diagrams of integrated circuit devices according to another example embodiment of the inventive concepts.
Figure 2B:
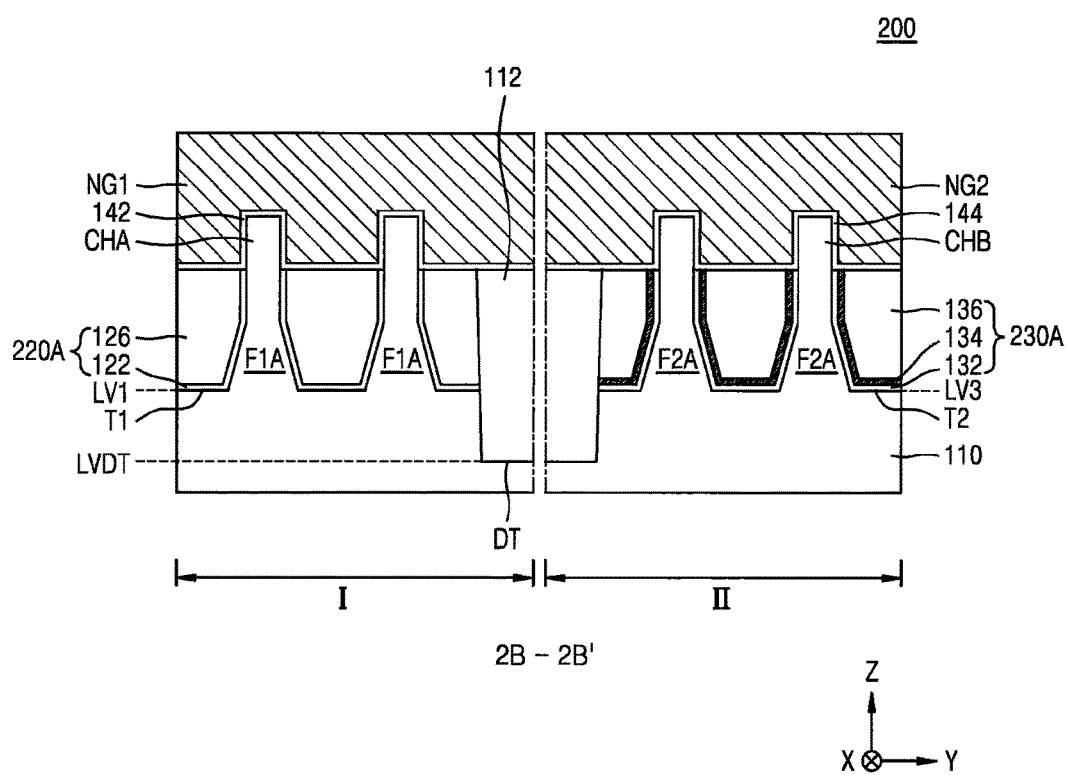
Figure 2C:
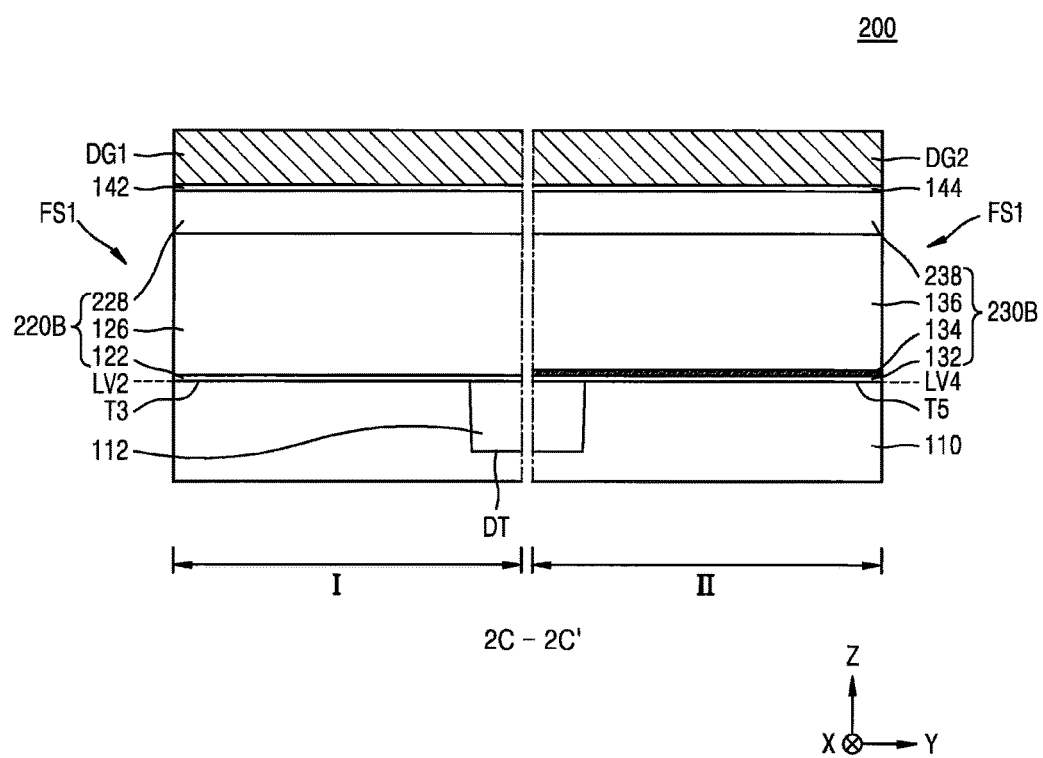
Figure 2D:
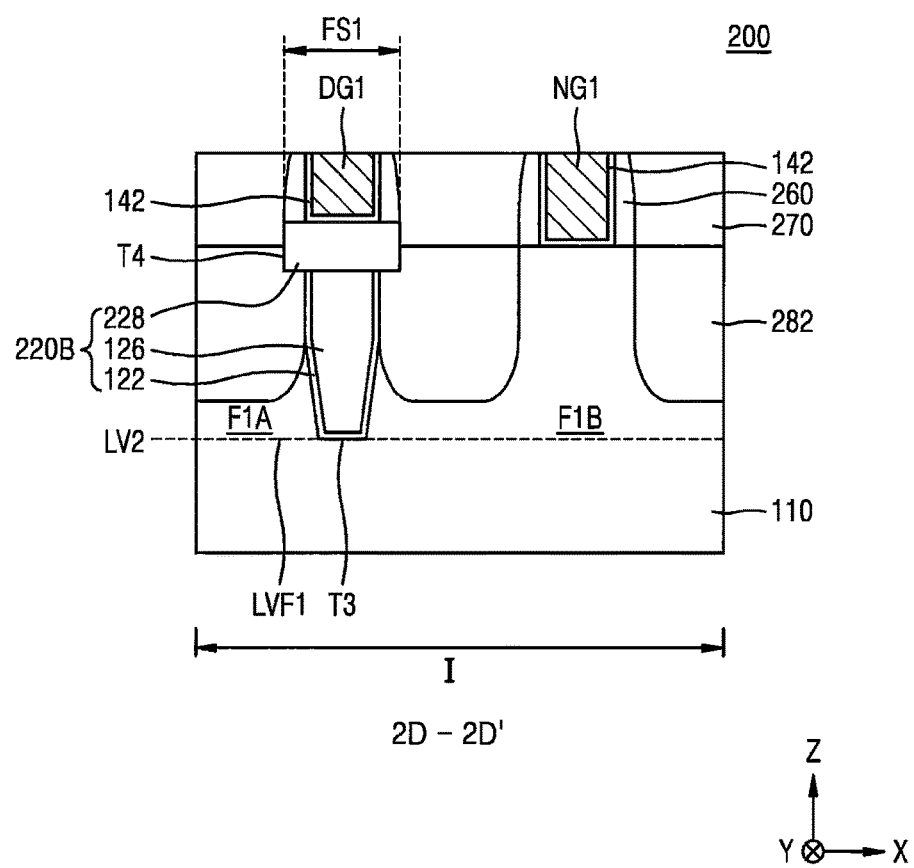
Figure 2E:
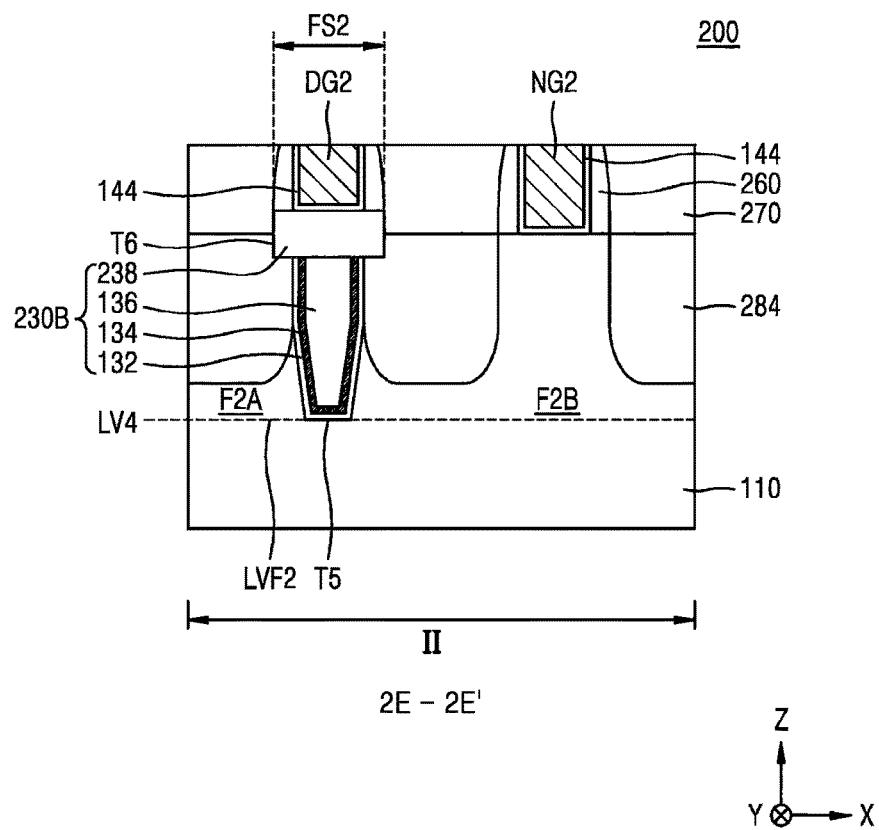

FIGS. 2A through 2E are diagrams of an integrated circuit device 200 according to another example embodiment of the inventive concepts. FIG. 2A is a plan layout diagram of the integrated circuit device 200, FIG. 2B is a cross-sectional view taken along a line 2B-2B' of FIG. 2A, FIG. 2C is a cross-sectional view taken along a line 2C-2C' of FIG. 2A, FIG. 2D is a cross-sectional view taken along a line 2D-2D' of FIG. 2A, and FIG. 2E is a cross-sectional view taken along a line 2E-2E' of FIG. 2A. In FIGS. 2A through 2E, reference numerals that are the same as those of FIGS. 1A and 1B denote the same or similar elements, and thus, their detailed description will be omitted.

Referring to FIGS. 2A through 2E, the integrated circuit device 200 includes a substrate 110 having a first region I and a second region II.

A plurality of first fin-type active regions F1A and F1B protrude from the first region I of the substrate 110 toward a direction (Z direction) perpendicular to a main surface of the substrate 110. Each of the plurality of first fin-type active regions F1A and F1B may have a first conductive type channel region CHA. Both sidewalls of each of the plurality of first fin-type active regions F1A and F1B may be covered with a first device isolation layer 220A below the first conductive type channel region CHA.

A plurality of second fin-type active regions F2A and F2B protrude from the second region II of the substrate 110 toward a first direction (Z direction). Each of the plurality of second fin-type active regions F2A and F2B may have a second conductive type channel region CHB. Both sidewalls of each of the plurality of second fin-type active regions F2A and F2B may be covered with a second device isolation layer 230A below the second conductive type channel region CHB.

The plurality of first fin-type active regions F1A and F1B and the plurality of second fin-type active regions F2A and F2B may extend parallel to each other in the X-direction on the substrate 110. Each of the first fin-type active regions F1A and each of the first fin-type active regions F1B may be spaced apart from each other with a first fin isolation region FS1 interposed therebetween. Each of the second fin-type active regions F2A and each of the second fin-type active regions F2B may be spaced apart from each other with a second fin isolation region FS2 interposed therebetween. In some embodiments, the first fin isolation region FS1 and the second fin isolation region FS2 may be connected to each other. In some embodiments, the first fin isolation region FS1 and the second fin isolation region FS2 may be spaced apart from each other.

In FIG. 2A, although four first fin-type active regions F1A and four first fin-type active region F1B are formed in the first region I and four second fin-type active regions F2A and four second fin-type active regions F2B are formed in the second region II, the inventive concepts are not limited thereto. For example, three or less or five or more first fin-type active regions F1A and three or less or five or more first fin-type active region F1B may be formed in the first region I and three or less or five or more second fin-type active regions F2A and three or less or five or more second fin-type active regions F2B may be formed in the second region II.

In the first region I of the substrate 110, a plurality of normal gates NG1 and a dummy gate DG1 may extend in a direction (Y direction) intersecting with an extending direction (X direction) of the plurality of first fin-type active regions F1A and F1B. In the second region II of the substrate 110, a plurality of normal gates NG2 and a dummy gate DG2 may extend in a direction (Y direction) intersecting with an extending direction (X direction) of the plurality of second fin-type active regions F2A and F2B. The dummy gate DG1 and the dummy gate DG2 may be disposed in the first fin isolation region FS1 and the second fin isolation region FS2, respectively.

In the integrated circuit device 200, first device isolation layers 220A and 220B, which provide insulating regions between the plurality of first fin-type active regions F1A and F1B, may be formed in the first region I of the substrate 110. The first device isolation layers 220A and 220B may include a low level first device isolation layer 220A (refer to FIG. 2B) and a high level first device isolation layer 220B (refer to FIG. 2C and FIG. 2D).

The low level first device isolation layer 220A may be disposed in a region between each corresponding pair of the plurality of first fin-type active regions F1A and F1B in a short axis direction (Y direction in FIG. 2A) of the plurality of first fin-type active regions F1A and F1B in the first region I, may extend in a direction parallel to the plurality of first fin-type active regions F1A and F1B, and may have an upper surface having a level that is lower than those of upper surfaces of the plurality of first fin-type active regions F1A and F1B. The low level first device isolation layer 220A may be formed to fill the inside of a first trench T1 extending parallel to the plurality of first fin-type active regions F1A and F1B between each corresponding pair of the plurality of first fin-type active regions F1A and F1B. The low level first device isolation layer 220A may include a first insulating liner 122 and a first gapfill insulating layer 126, sequentially stacked from an inside wall of the first trench T1 formed in the first region I, like the first device isolation layer 120 illustrated in FIGS. 1A and 1B.

As illustrated in FIG. 2A, the high level first device isolation layer 220B may be disposed in a region between a pair of first fin-type active regions F1A and F1B adjacent to each other in a long axis direction (X direction in FIG. 2A) of the plurality of first fin-type active regions F1A and F1B, and may extend in a direction intersecting with the plurality of first fin-type active regions F1A and F1B.

As illustrated in FIG. 2D, the high level first device isolation layer 220B may have an upper surface having a level that is higher than those of upper surfaces of the plurality of first fin-type active regions F1A and F1B. However, the inventive concepts are not limited thereto. For example, the high level first device isolation layer 220B may have an upper surface having a level that is substantially the same as those of the upper surfaces of the plurality of first fin-type active regions F1A and F1B. This will be described later with reference to FIGS. 3A and 3B.

As illustrated in FIG. 2D, the high level first device isolation layer 220B may be formed to fill the inside of a fin isolation trench T3 and the inside of an upper trench T4. The fin isolation trench T3 may be formed to extend in a direction, which is parallel to the plurality of normal gates NG1 and the dummy gate DG1, in the first fin isolation region FS1 placed between a pair of first fin-type active regions F1A and F1B adjacent to each other. The upper trench T4 may be formed on the fin isolation trench T3 to communicate with the fin isolation trench T3 and may have a width that is larger than that of the fin isolation trench T3. The high level first device isolation layer 220B may include a first insulating liner 122 and a first gapfill insulating layer 126, sequentially stacked from an inside wall of the fin isolation trench T3 formed in the first region I, similar to the first device isolation layer 120 illustrated in FIGS. 1A and 1B. However, the high level first device isolation layer 220B may further include a first upper buried layer 228 formed in the upper trench T4. The first upper buried layer 228 may be formed on the first gapfill insulating layer 126 to contact the first insulating liner 122 and the first gapfill insulating layer 126.

In some embodiments, the first upper buried layer 228 may be an oxide film formed by a coating process or a deposition process. For example, the first upper buried layer 228 may be formed of FSG, USG, BPSG, PSG, FOX, PE-TEOS, or TOSZ.

As illustrated in FIG. 2A, a dummy gate DG1 may be formed on a high level first device isolation layer 220B so that the high level first device isolation layer 220B and the dummy gate DG1 correspond to each other one to one. The dummy gate DG1 may be disposed between a pair of adjacent normal gates NG1. The high level first device isolation layer 220B may be disposed to be vertically overlapped by the dummy gate DG1, and may extend in the direction (Y direction) intersecting with the extending direction (X direction) of the plurality of first fin-type active regions F1A and F1B together with the dummy gate DG1.

The low level first device isolation layer 220A and the high level first device isolation layer 220B may be formed so that their bottoms are positioned in substantially the same level. In some embodiments, a bottom level LV1 (refer to FIG. 2B) of the low level first device isolation layer 220A and a bottom level LV2 (refer to FIG. 2D) of the high level first device isolation layer 220B may be substantially the same as a level LVF1 of bottoms of the plurality of first fin-type active regions F1A and F1B. However, the inventive concepts are not limited thereto. For example, the bottom of the high level first device isolation layer 220B may have a level that is different from a level of the bottom of the low level first device isolation layer 220A.

In the integrated circuit device 200, second device isolation layers 230A and 230B, which provide insulating regions between the plurality of second fin-type active regions F2A and F2B, may be formed in the second region II of the substrate 110. The second device isolation layers 230A and 230B may include a low level second device isolation layer 230A (refer to FIG. 2B) and a high level second device isolation layer 230B (refer to FIG. 2A and FIG. 2E).

The low level second device isolation layer 230A may be disposed between each corresponding pair of the plurality of second fin-type active regions F2A and F2B in a short axis direction (Y direction in FIG. 2A) of the plurality of second fin-type active regions F2A and F2B in the second region II, may extend in a direction parallel to the plurality of second fin-type active regions F2A and F2B, and may have an upper surface having a level that is lower than those of upper surfaces of the plurality of second fin-type active regions F2A and F2B. The low level second device isolation layer 230A may be formed to fill the inside of a second trench T2 extending parallel to the plurality of second fin-type active regions F2A and F2B between each corresponding pair of the plurality of second fin-type active regions F2A and F2B. The low level second device isolation layer 230A may include a second insulating liner 132, a third insulating liner 134, and a second gapfill insulating layer 136, sequentially stacked from an inside wall of the second trench T2 formed in the second region II, like the second device isolation layer 130 illustrated in FIGS. 1A and 1B.

As illustrated in FIG. 2A, the high level second device isolation layer 230B may be disposed in a region between a pair of second fin-type active regions F2A and F2B adjacent to each other in a long axis direction (X direction in FIG. 2A) of the plurality of second fin-type active regions F2A and F2B, and extends in a direction intersecting with the plurality of second fin-type active regions F2A and F2B.

As illustrated in FIG. 2E, the high level second device isolation layer 230B may have an upper surface having a level that is higher than those of upper surfaces of the plurality of second fin-type active regions F2A and F2B. However, the inventive concepts are not limited thereto. For example, the high level second device isolation layer 230B may have an upper surface having a level that is substantially the same as those of the upper surfaces of the plurality of second fin-type active regions F2A and F2B. This will be described later with reference to FIGS. 3A and 3B.

As illustrated in FIG. 2E, the high level second device isolation layer 230B may be formed to fill the inside of a fin isolation trench T5 and the inside of an upper trench T6. The fin isolation trench T5 may be formed to extend in a direction, which is parallel to the plurality of normal gates NG2 and the dummy gate DG2, in the second fin isolation region FS2 between a pair of second fin-type active regions F2A and F2B adjacent to each other. The upper trench T6 may be formed on the fin isolation trench T5 to communicate with the fin isolation trench T5 and may have a width that is larger than that of the fin isolation trench T5. The high level second device isolation layer 230B may include a second insulating liner 132, a third insulating liner 134, and a second gapfill insulating layer 136, sequentially stacked from an inside wall of the fin isolation trench T5 formed in the second region II, similar to the second device isolation layer 130 illustrated in FIGS. 1A and 1B. However, the high level second device isolation layer 230B may further include a second upper buried layer 238 formed in the upper trench T6. In some embodiments, the second upper buried layer 238 may be an oxide film formed by a coating process or a deposition process. For example, the second upper buried layer 238 may be formed of FSG, USG, BPSG, PSG, FOX, PE-TEOS, or TOSZ. In some embodiments, the second upper buried layer 238 (refer to FIG. 2E) formed in the second region II may be formed of the same material as the first upper buried layer 228 (refer to FIG. 2D) formed in the first region I.

As illustrated in FIG. 2A, a dummy gate DG2 may be formed on a high level second device isolation layer 230B so that the high level second device isolation layer 230B and the dummy gate DG2 correspond to each other one to one. The dummy gate DG2 may be disposed between two adjacent normal gates NG2. The high level second device isolation layer 230B may be disposed to be vertically overlapped by the dummy gate DG2, and may extend in a direction (Y direction) intersecting with an extending direction (X direction) of the plurality of second fin-type active regions F2A and F2B together with the dummy gate DG2.

The low level second device isolation layer 230A and the high level second device isolation layer 230B may be formed so that their bottoms are positioned in substantially the same level. In some embodiments, a bottom level LV3 (refer to FIG. 2B) of the low level second device isolation layer 230A and a bottom level LV4 (refer to FIG. 2E) of the high level second device isolation layer 230B may be substantially the same as a level LVF2 of bottoms of the plurality of second fin-type active regions F2A and F2B. However, the inventive concepts are not limited thereto. For example, the bottom of the high level second device isolation layer 230B may have a level that is different from a level of the bottom of the low level second device isolation layer 230A.

A bottom level LVDT of an insulating layer 112 for device region isolation, formed in a deep trench DT (refer to FIG. 2B) between the first region I and the second region II, may be lower than the bottom level LV1 of the low level first device isolation layer 220A and the bottom level LV2 of the high level first device isolation layer 220B. In addition, the bottom level LVDT of the insulating layer 112 for device region isolation may be lower than the bottom level LV3 of the low level second device isolation layer 230A and the bottom level LV4 of the high level second device isolation layer 230B.

The plurality of normal gates NG1 and the dummy gate DG1, formed in the first region I, and the plurality of normal gates NG2 and the dummy gate DG2, formed in the second region II, may have a structure that is similar to that described with respect to the first and second gates 152 and 154 with reference to FIGS. 1A and 1B.

Both sidewalls of each of the plurality of normal gates NG1 and the dummy gate DG1 may be covered with an insulating spacer 260 and an inter-gate insulating layer 270. In some embodiments, the insulating spacer 260 may include a silicon nitride ($Si_3N_4$) film, a silicon oxynitride (SiON) film, a carbon-containing silicon oxynitride (SiCON) film, or a combination thereof. The inter-gate insulating layer 270 may include any one selected from a tetra ethyl ortho silicate (TEOS) film and an ultra low K (ULK) film (e.g., a SiOC film and a SiCOH film) having an ultra low dielectric constant K of about 2.2 to about 2.4.

In some embodiments, the plurality of normal gates NG1 and NG2 and the dummy gates DG1 and DG2 may be formed by a gate-last process that may be also be known as a replacement poly-gate (RPG) process. However, the inventive concepts are not limited thereto.

In the first region I, a first gate insulating film 142 may be interposed between each of the plurality of normal gates NG1 and each of the plurality of first fin-type active regions F1A and F1B and between the dummy gate DG1 and the first upper buried layer 228.

In the first region I, a source/drain region 282 may be formed, at both sides of each of the plurality of normal gates NG1, in each of the plurality of the first fin-type active regions F1A and F1B. A portion of a source/drain region 282, which is positioned at both sides of the first fin isolation region FS1 from among a plurality of source/drain regions 282 formed in the plurality of first fin-type active regions F1A and F1B, may be vertically overlapped by the first upper buried layer 228 formed in the upper trench T4 and the insulating spacer 260, and thus may be tucked under the first upper buried layer 228.

In the second region II, a second gate insulating film 144 may be disposed between each of the plurality of normal gates NG2 and each of the plurality of second fin-type active regions F2A and F2B and between the dummy gate DG2 and the second upper buried layer 238.

In the second region II, a source/drain region 284 may be formed, at both sides of each of the plurality of normal gates NG2, in each of the plurality of the second fin-type active regions F2A and F2B. A portion of a source/drain region 284, which is positioned at both sides of the second fin isolation region FS2 from among a plurality of source/drain regions 284 formed in the plurality of second fin-type active regions F2A and F2B, may be vertically overlapped by the second upper buried layer 238 formed in the upper trench T6 and the insulating spacer 260, and thus may be tucked under the second upper buried layer 238.

In the integrated circuit device 200 described with reference to FIGS. 2A through 2E, each of the second device isolation layers 230A and 230B in the second region II includes the third insulating liner 134 between the second insulating liner 132 and the second gapfill insulating layer 136. In contrast, in the first region I each of the first device isolation layers 220A and 220B does not include the third insulating liner 134. Accordingly, in the first device isolation layers 220A and 220B, the first insulating liner 122 may directly contact the first gapfill insulating layer 126, and the first gapfill insulating layer 126 may be disposed in a position relatively adjacent to the first fin-type active regions F1A and F1B with the first insulating liner 122 interposed therebetween. Accordingly, when the first gapfill insulating layer 126 is heat-treated in subsequent various processes after the first gapfill insulating layer 126 is formed, a stress that is caused due to shrinkage of the first gapfill insulating layer 126 may be transmitted to the first fin-type active regions F1A and F1B and thus a tensile stress may be applied to the first conductive type channel region CHA of each of the first fin-type active regions F1A and F1B. As a result, when an NMOS transistor is implemented in the first region I, the performance of the NMOS transistor may be improved.

As each of the second device isolation layers 230A and 230B formed in the second region II includes the third insulating liner 134 that functions as a barrier between the second insulating liner 132 and the second gapfill insulating layer 136, a tensile stress, which may be caused in the second conductive type channel region CHB of each of the second fin-type active regions F2A and F2B due to the second gapfill insulating layer 136, may be minimized by the third insulating liner 134. By forming the third insulating liner 134 by using polysilicon or nitride, a compression stress may be introduced in the second conductive type channel region CHB by using the third insulating liner 134 in the second region II. Accordingly, carrier mobility in the second conductive type channel region CHB may be improved.

Figure 3A:
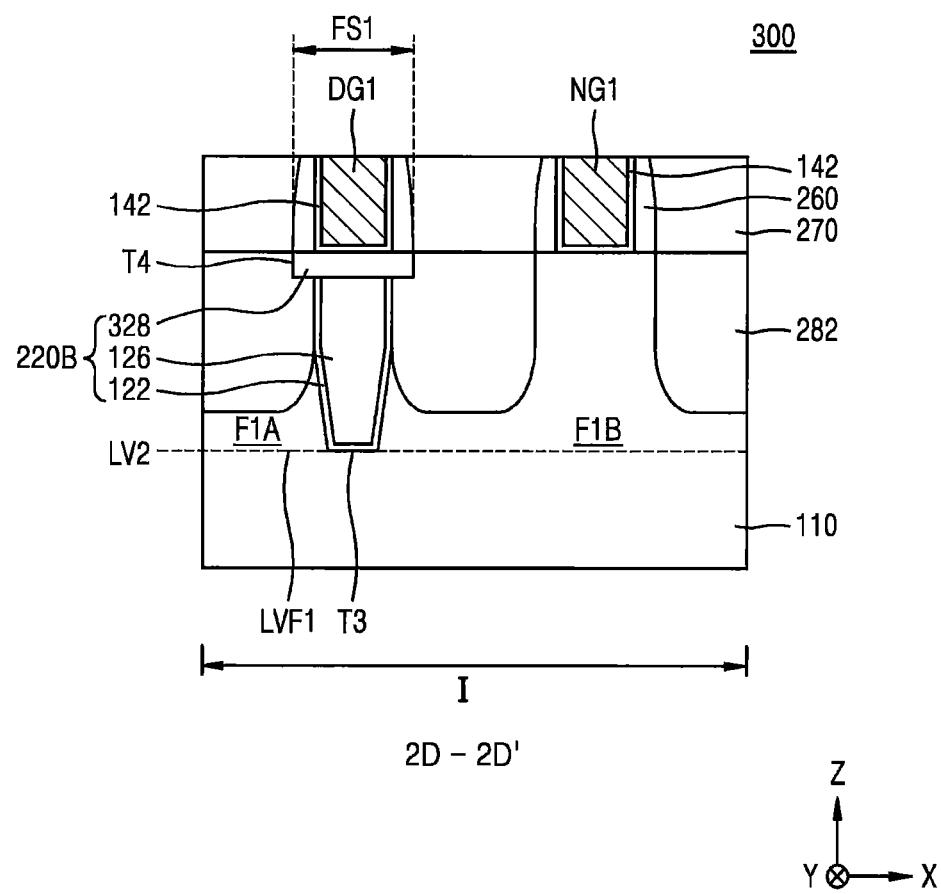
FIGS. 3A and 3B are diagrams of integrated circuit devices according to another example embodiment of the inventive concepts.
Figure 3B:
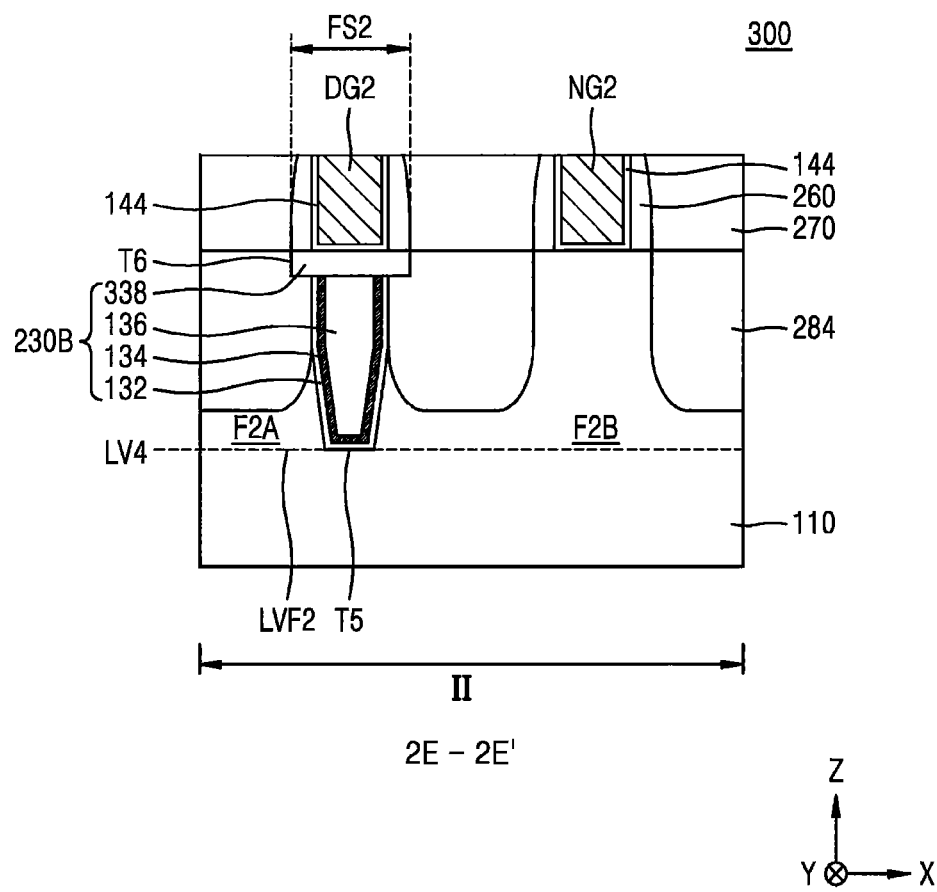

FIGS. 3A and 3B are diagrams of an integrated circuit device 300 according to another example embodiment of the inventive concepts. The integrated circuit device 300 may have a plan layout that is the same or similar as that illustrated in FIG. 2A. In more detail, FIG. 3A is a cross-sectional view of a part corresponding to a cross section taken along a line 2D-2D' of FIG. 2A, and FIG. 3B is a cross-sectional view of a part corresponding to a cross section taken along a line 2E-2E' of FIG. 2A. In FIGS. 3A and 3B, reference numerals that are the same as those of FIGS. 1A through 2E denote the same or similar elements, and thus, their detailed description will be omitted.

Referring to FIGS. 3A and 3B, the integrated circuit device 300 has substantially the same structure as the integrated circuit device 200 described with reference to FIGS. 2A through 2E. However, in a high level first device isolation layer 220B formed in a first region I of a substrate 110, an upper surface of an upper buried layer 328 formed in an upper trench T4 may be positioned at a level that is substantially the same as those of upper surfaces of a plurality of first fin-type active regions F1A and F1B. In a high level second device isolation layer 230B formed in a second region II of the substrate 110, an upper surface of an upper buried layer 338 formed in an upper trench T6 may be positioned at a level that is substantially the same as those of upper surfaces of a plurality of second fin-type active regions F2A and F2B. More details of the upper buried layers 328 and 338 are the same or similar as those described with respect to the first and second upper buried layers 228 and 238 with respect to FIGS. 2A through 2E.

Figure 4A:
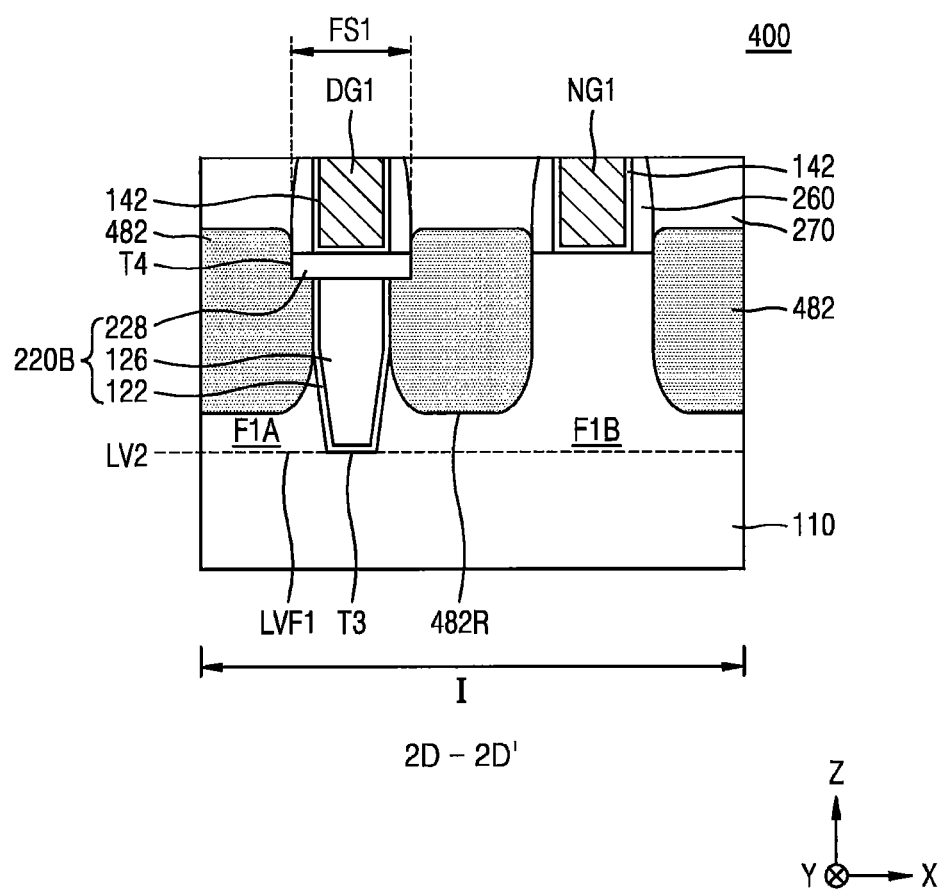
FIGS. 4A and 4B are diagrams of integrated circuit devices according to another example embodiment of the inventive concepts.
Figure 4B:
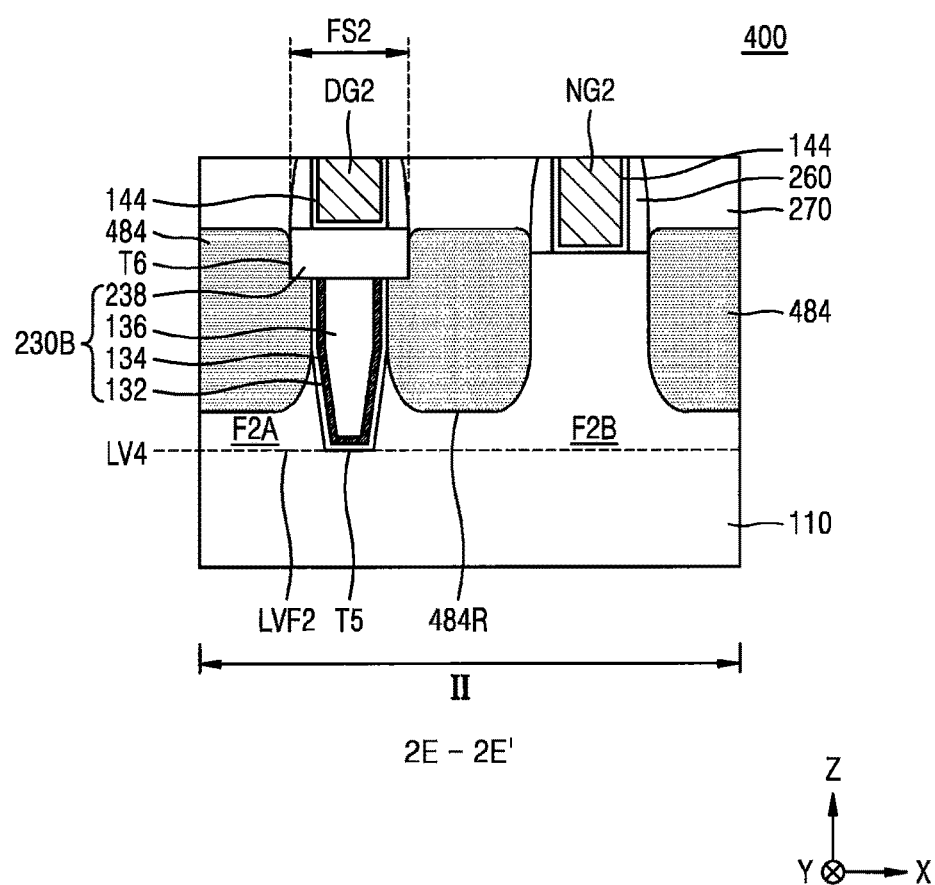

FIGS. 4A and 4B are diagrams of an integrated circuit device 400 according to another example embodiment of the inventive concepts. The integrated circuit device 400 may have a plan layout that is substantially the same as that illustrated in FIG. 2A. In more detail, FIG. 4A is a cross-sectional view of a part corresponding to a cross section taken along a line 2D-2D' of FIG. 2A, and FIG. 4B is a cross-sectional view of a part corresponding to a cross section taken along a line 2E-2E' of FIG. 2A. In FIGS. 4A and 4B, reference numerals that are the same as those of FIGS. 1A through 2E denote the same or similar elements, and thus, their detailed description will be omitted.

Referring to FIGS. 4A and 4B, the integrated circuit device 400 has substantially the same structure as the integrated circuit device 200 described with reference to FIGS. 2A through 2E. However, a source/drain region 482 having a raised source/drain (RSD) structure may be formed in each of a plurality of first fin-type active regions F1A and F1B of a first region I, and a source/drain region 484 having an RSD structure may be formed in each of a plurality of second fin-type active regions F2A and F2B of a second region II.

In more detail, in the first region I, a source/drain region 482 having an RSD structure may be formed, at both sides of a normal gate NG1, in each of the plurality of first fin-type active regions F1A and F1B. In the second region II, a source/drain region 484 having an RSD structure may be formed, at both sides of a normal gate NG2, in each of the plurality of second fin-type active regions F2A and F2B.

To form the source/drain regions 482 and 484 in the first and second regions I and II, recesses 482R and 484R may be formed by removing portions of the first and second fin-type active regions F1A, F1B, F2A, and F2B. Next, a semiconductor layer for forming the source/drain regions 482 and 484 may be formed in the recesses 482R and 484R by an epitaxial growth process. In some embodiments, a source/drain region 482 formed of Si or SiC may be formed in the first region I. In the first region I, an N+ doping process may be simultaneously performed while epitaxially growing a semiconductor layer formed of Si or SiC. A source/drain region 484 formed of SiGe may be formed in the second region II. In the second region II, a P+ doping process may be simultaneously performed while epitaxially growing a semiconductor layer formed of SiGe.

The source/drain regions 482 and 484 may have upper surfaces at a higher level than upper surfaces of the first and second fin-type active regions F1A, F1B, F2A, and F2B.

In the first region I, a portion of a source/drain region 482, which is positioned at both sides of a first fin isolation region FS1 from among a plurality of source/drain regions 482 formed in the plurality of first fin-type active regions F1A and F1B, may be vertically overlapped by a first upper buried layer 228 formed in an upper trench T4 and an insulating spacer 260, and thus may be tucked under the first upper buried layer 228.

In the second region II, a portion of a source/drain region 484, which is positioned at both sides of a second fin isolation region FS2 from among a plurality of source/drain regions 484 formed in the plurality of second fin-type active regions F2A and F2B, may be vertically overlapped by a second upper buried layer 238 formed in an upper trench T6 and an insulating spacer 260, and thus may be tucked under the second upper buried layer 238.

In the integrated circuit devices 200, 300, and 400 illustrated in FIGS. 2A through 4B, the first device isolation layer 220B, which is disposed under the dummy gate DG1 in the first region I of the substrate 110, and the second device isolation layer 230B, which is disposed under the dummy gate DG2 in the second region II of the substrate 110, may each have an upper surface having a level that is substantially the same as or higher than those of the upper surfaces of the plurality of first and second fin-type active regions F1A, F1B, F2A, and F2B. Accordingly, the dummy gate DG1 may not be disposed in a space between the plurality of first fin-type active regions F1A and F1B, and the dummy gate DG2 may not be disposed in a space between the plurality of second fin-type active regions F2A and F2B. Accordingly, compared to the case in which a level of the upper surface of each of the first and second device isolation layers 220B and 230B is lower than those of the upper surfaces of the plurality of first and second fin-type active regions F1A, F1B, F2A, and F2B, parasitic capacitance, which is formed between the dummy gate DG1 and the first fin-type active regions F1A and FB, and parasitic capacitance, which is formed between the dummy gate DG2 and the second fin-type active regions F2A and F2B, may be very small. In addition, a leakage current may be reduced or suppressed by securing a separation distance between the dummy gate DG1 and the first fin-type active regions F1A and F1B, and a separation distance between the dummy gate DG2 and the second fin-type active regions F2A and F2B. In addition, by making the widths (the widths in the X direction) of the upper buried layers 228, 238, 328, and 338 in the first and second device isolation layers 220B and 230B be larger than the width (the width in the X direction) of the dummy gates DG1 and DG2, an alignment margin may be secured when forming the dummy gates DG1 and DG2 on the first and second device isolation layers 220B and 230B.

FIGS. 5A through 5I are cross-sectional views that sequentially illustrate methods of manufacturing integrated circuit devices, according to an example embodiment of the inventive concepts. A method of manufacturing the integrated circuit device 100 illustrated in FIGS. 1A and 1B is described below with reference to FIGS. 5A through 5I. In FIGS. 5A through 5I, reference numerals that are the same as those of FIGS. 1A and 1B denote the same or similar elements; and thus, their detailed description will be omitted.

Figure 5A:
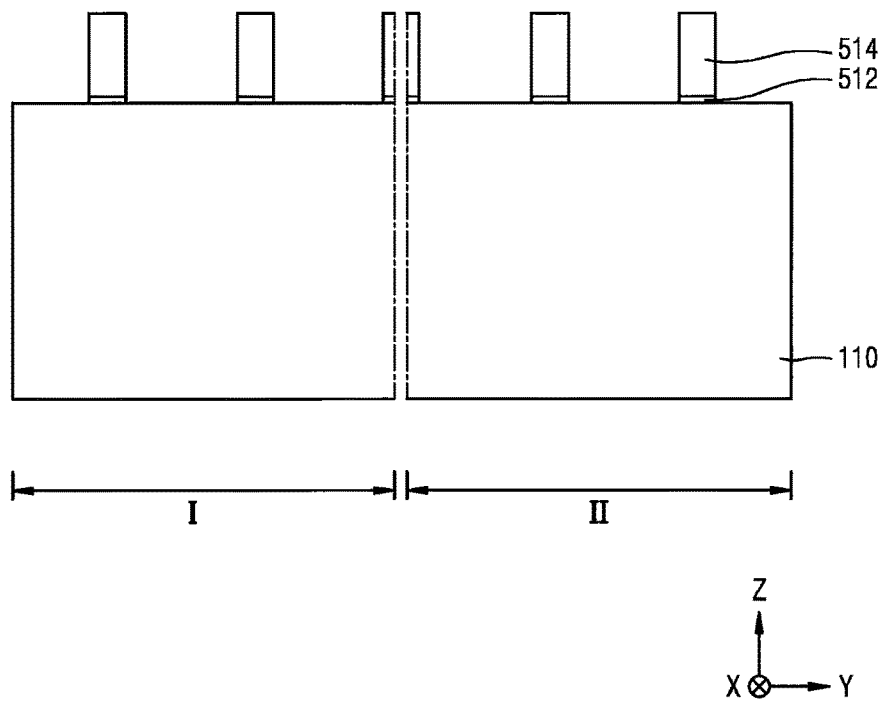
FIGS. 5A through 5I are cross-sectional views that sequentially illustrate methods of manufacturing integrated circuit devices, according to an example embodiment of the inventive concepts.

Referring to FIG. 5A, a substrate 110, which includes a first region I and a second region II, is prepared. A plurality of pad oxide film patterns 512 and a plurality of mask patterns 514 may be formed on the first region I and the second region II of the substrate 110.

The plurality of pad oxide film patterns 512 and the plurality of mask patterns 514 may extend parallel to each other on the substrate 110 in one direction (X direction).

In some embodiments, the plurality of pad oxide film patterns 512 may be formed of an oxide film obtained by thermally oxidizing a surface of the substrate 110. The plurality of mask patterns 514 may be formed of a silicon nitride film, a silicon oxynitride film, a spin on glass (SOG) film, a spin on hardmask (SOH) film, a photoresist film, or a combination thereof, but is not limited thereto.

Figure 5B:
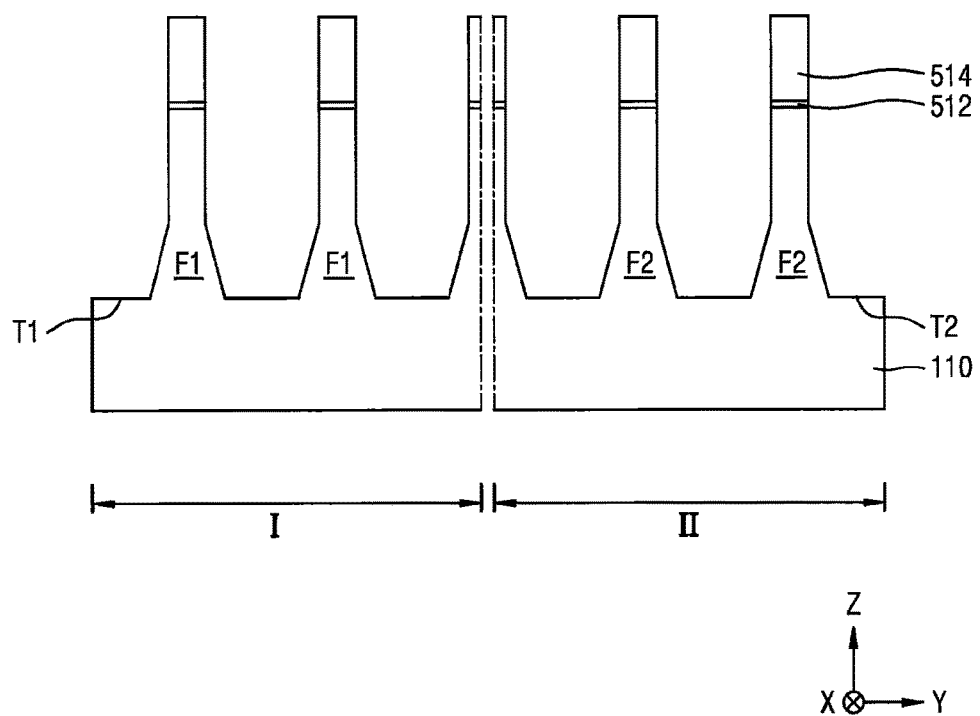

Referring to FIG. 5B, a portion of the substrate 110 may be etched by using the plurality of mask patterns 514 as an etch mask, and thus, a plurality of first and second trenches T1 and T2 may be formed in the substrate 110. As the plurality of first and second trenches T1 and T2 are formed, a plurality of first and second fin-type active regions F1 and F2, which protrude from the substrate 110 upward in a direction (Z direction) perpendicular to a main surface of the substrate 110 and extend in one direction (X direction), may be obtained.

Figure 5C:
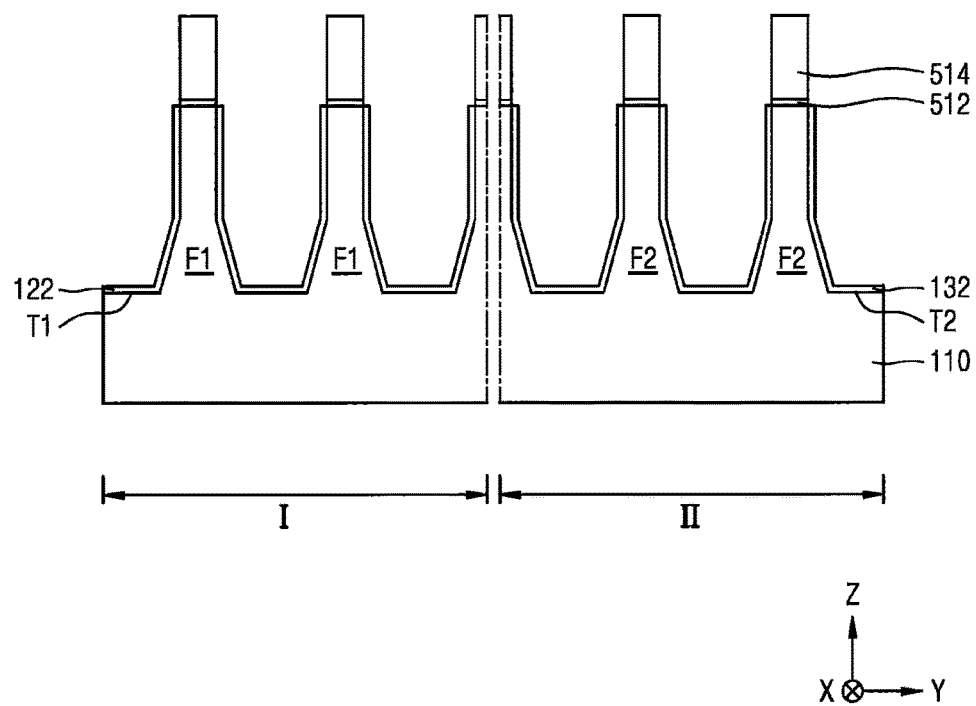

Referring to FIG. 5C, a first insulating liner 122 covering exposed surfaces of the plurality of first fin-type active regions F1 may be formed in the first region I, and a second insulating liner 132 covering exposed surfaces of the plurality of second fin-type active regions F2 may be formed in the second region II.

The first insulating liner 122 and the second insulating liner 132 may be obtained by performing a process of oxidizing the exposed surfaces of the first fin-type active regions F1 and the exposed surfaces of the second fin-type active regions F2. For example, the first insulating liner 122 and the second insulating liner 132 may be formed by using an ISSG process, a thermal oxidation process, a UV oxidation process, or an $O_2$ plasma oxidation process. In some embodiments, the first insulating liner 122 and the second insulating liner 132 may be simultaneously formed. The first insulating liner 122 and the second insulating liner 132 may be formed of the same material. Each of the first and second insulating liners 122 and 132 may have a thickness of about 10 Å to about 100 Å.

Figure 5D:
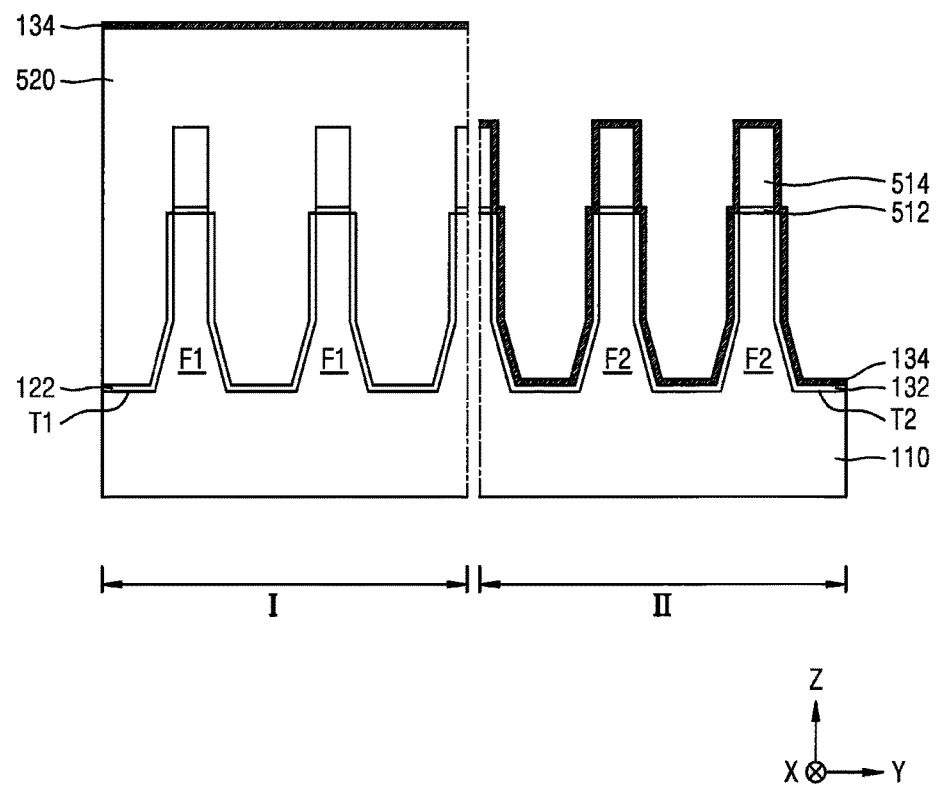

Referring to FIG. 5D, a mask pattern 520 covering the first region I may be formed so that the second region II of the substrate 110 is exposed, and then a third insulating liner 134 may be formed on the second insulating liner 132 in the second region II.

While the third insulating liner 134 is formed on the second insulating liner 132 in the second region II, the third insulating liner 134 may be formed on the mask pattern 520 in the first region I. In some embodiments, the mask pattern 520 may be formed of a photoresist film.

The third insulating liner 134 may have a uniform thickness to conformally cover the second insulating liner 132. The third insulating liner 134 may be formed of a material that is different from a constituent material of the first and second insulating liners 122 and 132.

In some embodiments, the third insulating liner 134 may be formed of polysilicon or nitride. The third insulating liner 134 may be formed by a CVD or ALD process. In some embodiments, the third insulating liner 134 may have a thickness of about 10 Å to about 100 Å.

Figure 5E:
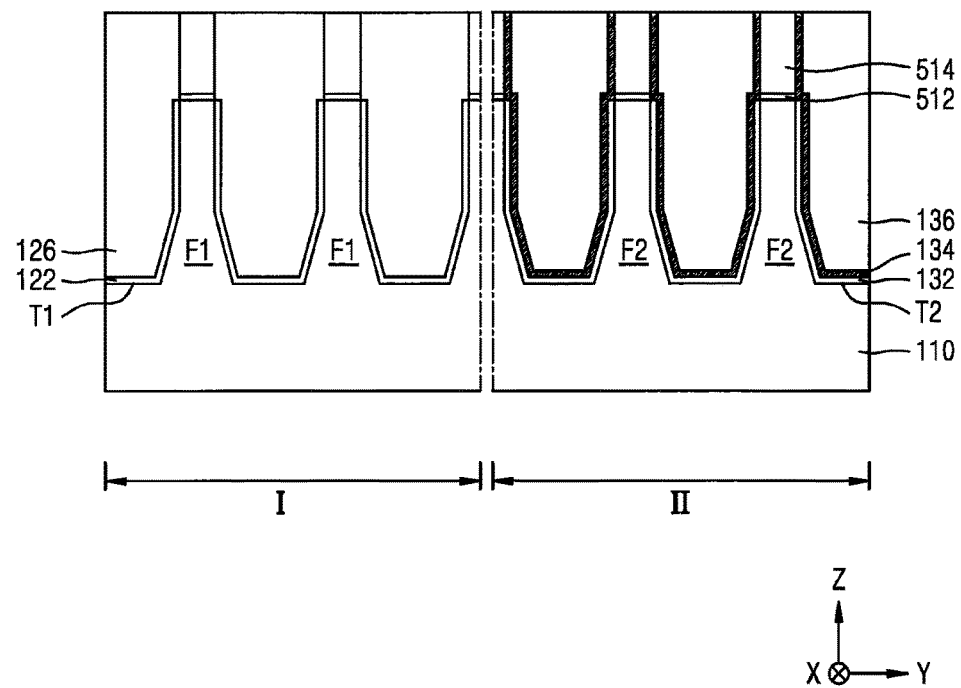

Referring to FIG. 5E, the mask pattern 520 and the third insulating liner 134 covering the mask pattern 520 may be removed to expose the first insulating liner 122 in the first region I, and then a first gapfill insulating layer 126 filling the plurality of first trenches T1 may be formed in the first region I and a second gapfill insulating layer 136 filling the plurality of second trenches T2 may be formed in the second region II.

The first gapfill insulating layer 126 and the second gapfill insulating layer 136 may be simultaneously formed and may be formed of the same material. To form the first gapfill insulating layer 126 and the second gapfill insulating layer 136, oxide may be deposited to fill the inside of each of the plurality of first and second trenches T1 and T2 and then the deposited oxide may be annealed.

The first gapfill insulating layer 126 and the second gapfill insulating layer 136 may be an oxide film formed by a FCVD process or a spin coating process. For example, the first gapfill insulating layer 126 and the second gapfill insulating layer 136 may be formed of FSG, USG, BPSG, PSG, FOX, PE-TEOS, or TOSZ. In some embodiments, an oxide film forming the second gapfill insulating layer 136 may be the same material film formed by the same or similar process as an oxide film forming the first gapfill insulating layer 126.

Figure 5F:
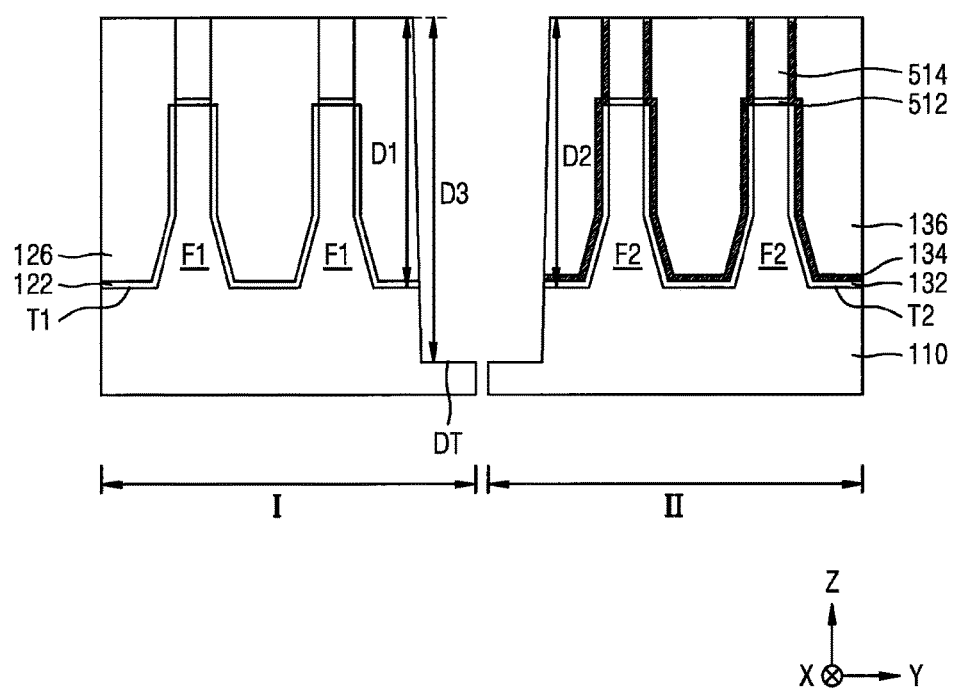

Referring to FIG. 5F, a deep trench DT may be formed by removing some of the plurality of first fin-type active regions F1, some of the plurality of second fin-type active regions F2, and their surrounding insulating layers.

The deep trench DT may have a depth D3 that is larger than the depth D1 of the first trench T1 and the depth D2 of the second trench T2. In some embodiments, the first region I and the second region II may be separated by the deep trench DT. For example, the depth D3 of the deep trench DT may be larger, by about 50 nm to about 150 nm, than the depth D1 of the first trench T1 and the depth D2 of the second trench T2.

In some embodiments, a process of forming a photoresist pattern on the resultant structure of FIG. 5E, which exposes a portion of an upper surface of a resultant structure, and dry-etching the exposed portion of the resultant structure by using the photoresist pattern as an etch mask may be used to form the deep trench DT.

Figure 5G:
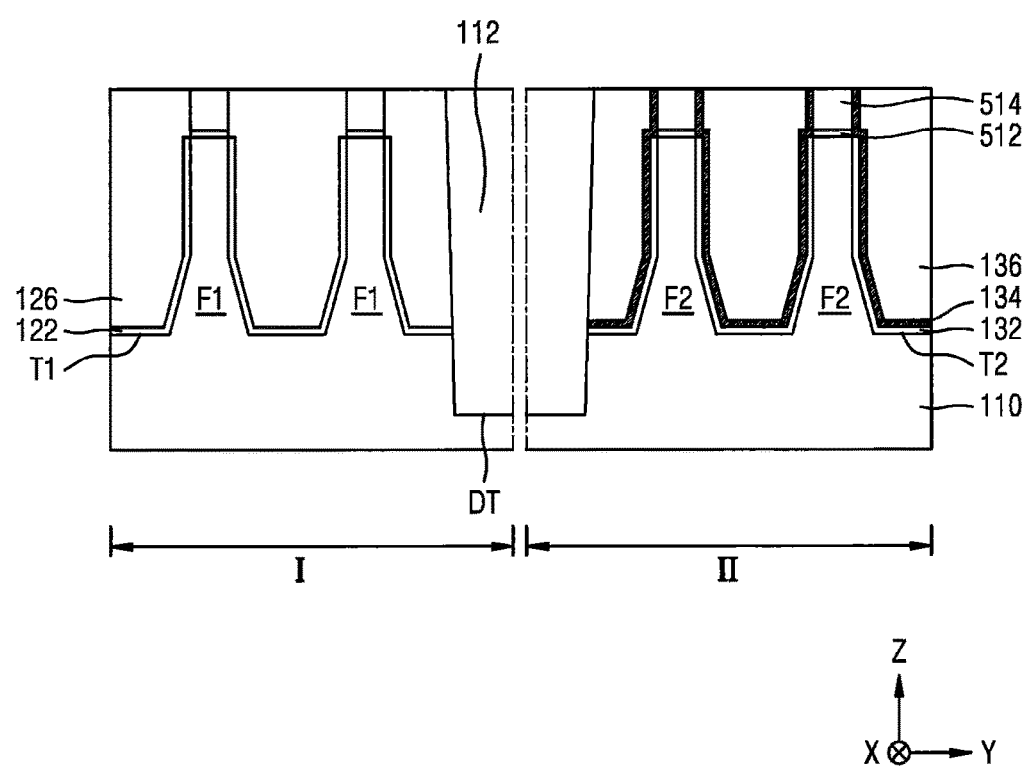

Referring to FIG. 5G, an insulating layer 112 for device region isolation may be formed to fill the deep trench DT.

A coating process or a deposition process may be used to form the insulating layer 112 for device region isolation. In some embodiments, the insulating layer 112 for device region isolation may be formed of a material that is different from those of the first and second gapfill insulating layers 126 and 136. For example, each of the first and second gapfill insulating layers 126 and 136 may be formed of an oxide film formed by an FCVD process, and the insulating layer 112 for device region isolation may be formed of USG. However, the inventive concepts are not limited thereto.

In the first region I, the insulating layer 112 for device region isolation may be formed to directly contact the first gapfill insulating layer 126. In the second region II, the insulating layer 112 for device region isolation may be formed to directly contact the second gapfill insulating layer 136.

In some embodiments, in order to form the insulating layer 112 for device region isolation, an insulating layer filling the deep trench DT may be formed and then an upper surface of the insulating layer may be planarized so that the plurality of mask patterns 514 are exposed. In this case, a portion of each of the plurality of mask patterns 514 and a portion of each of the first and second gapfill insulating layers 126 and 136 may be consumed, and thus, the heights of the plurality of mask patterns 514 and the heights of the first and second gapfill insulating layers 126 and 136 may be lowered.

Figure 5H:
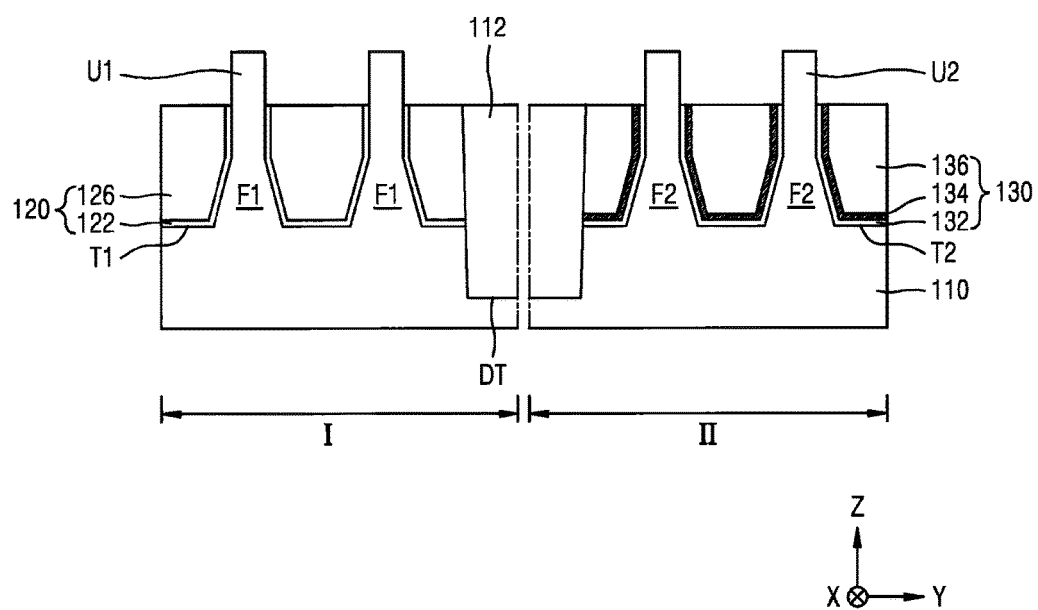

Referring to FIG. 5H, the plurality of mask patterns 514 (refer to FIG. 5G), the plurality of pad oxide film patterns 512 (refer to FIG. 5G), a portion of the insulating layer 112 for device region isolation, a portion of each of the first and second gapfill insulating layers 126 and 136, a portion of the third insulating liner 134, and a portion of each of the first and second insulating liners 122 and 132 may be removed so that upper surfaces and sidewalls of upper portions U1 and U2 of the first and second fin-type active regions F1 and F2 may be exposed.

As a result, first and second device isolation layers 120 and 130, which expose the upper portions U1 and U2 of the first and second fin-type active regions F1 and F2, may be formed in the first region I and the second region II.

In some embodiments, an impurity ion implantation process for threshold voltage adjustment may be performed on the exposed upper portions U1 and U2 of the first and second fin-type active regions F1 and F2. In the impurity ion implantation process for threshold voltage adjustment, boron (B) ions may be injected as impurities in a region, in which an NMOS transistor is formed, from among the first region I and the second region II, and phosphorus (P) ions or arsenic (As) ions may be injected as impurities in a region, in which a PMOS transistor is formed, from among the first region I and the second region II.

Figure 5I:
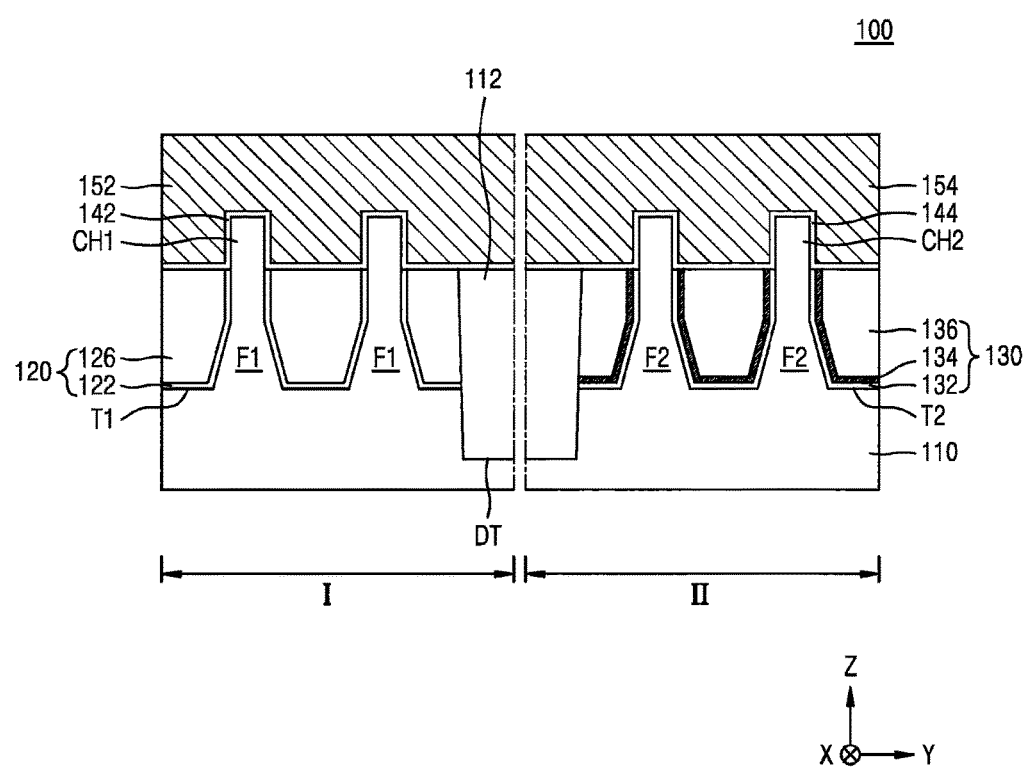

Referring to FIG. 5I, a first gate insulating film 142 and a first gate 152, which sequentially cover the exposed upper portion U1 (refer to FIG. 5H) of each of the plurality of first fin-type active regions F1, may be formed in the first region I, and a second gate insulating film 144 and a second gate 154, which sequentially cover the exposed upper portion U2 (refer to FIG. 5H) of each of the plurality of second fin-type active regions F2, may be formed in the second region II. In addition, a first source/drain region 162 (refer to FIG. 1A) may be formed, at both sides of the first gate 152, in each of the plurality of first fin-type active regions F1, and a second source/drain region 164 (refer to FIG. 1A) may be formed, at both sides of the second gate 154, in each of the plurality of second fin-type active regions F2. Accordingly, the integrated circuit device 100 illustrated in FIGS. 1A and 1B may be obtained.

In some embodiments, the first and second gates 152 and 154 may be formed by an RPG process. The upper portion U1 of each of the plurality of first fin-type active regions F1 may become a channel region CH1, and the upper portion U2 of each of the plurality of second fin-type active regions F2 may become a channel region CH2.

According to the method of manufacturing the integrated circuit device 100 described with reference to FIGS. 5A through 5I, an integrated circuit device, in which carrier mobility may be improved independently according to conductive types of the channel regions CH1 and CH2 formed in the first and second regions I and II, may be obtained by forming the first and second device isolation layers 120 and 130, which have different structures in the first region I and the second region II, by using a simplified process.

FIGS. 6A through 16B are cross-sectional views that sequentially illustrate methods of manufacturing integrated circuit devices, according to another example embodiment of the inventive concepts. A method of manufacturing the integrated circuit device 200 illustrated in FIGS. 2A through 2E is described below with reference to FIGS. 6A through 16B.

Figure 6A:
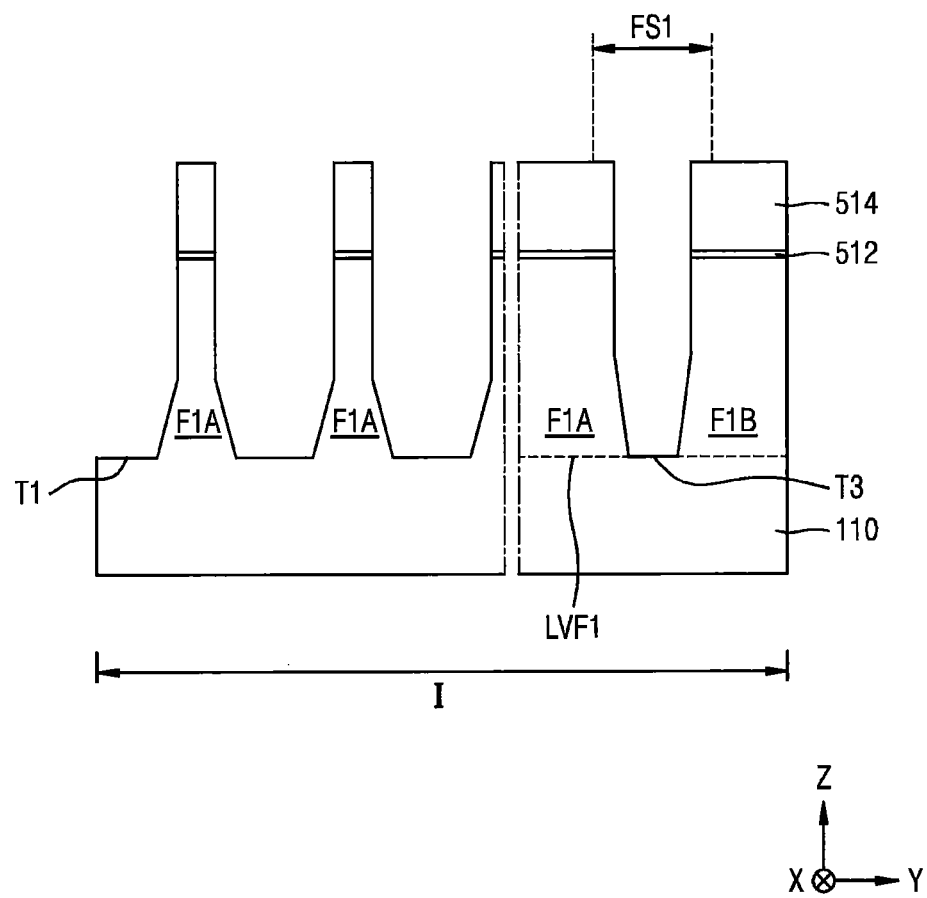
FIGS. 6A through 16B are cross-sectional views that sequentially illustrate methods of manufacturing integrated circuit devices, according to another example embodiment of the inventive concepts.
Figure 6B:
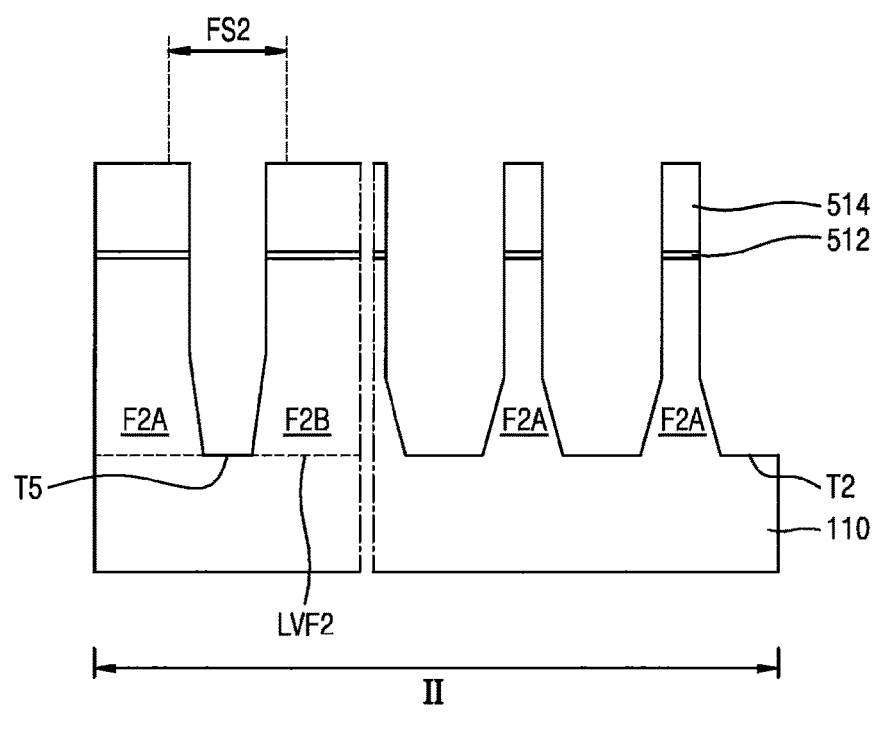
Figure 7A:
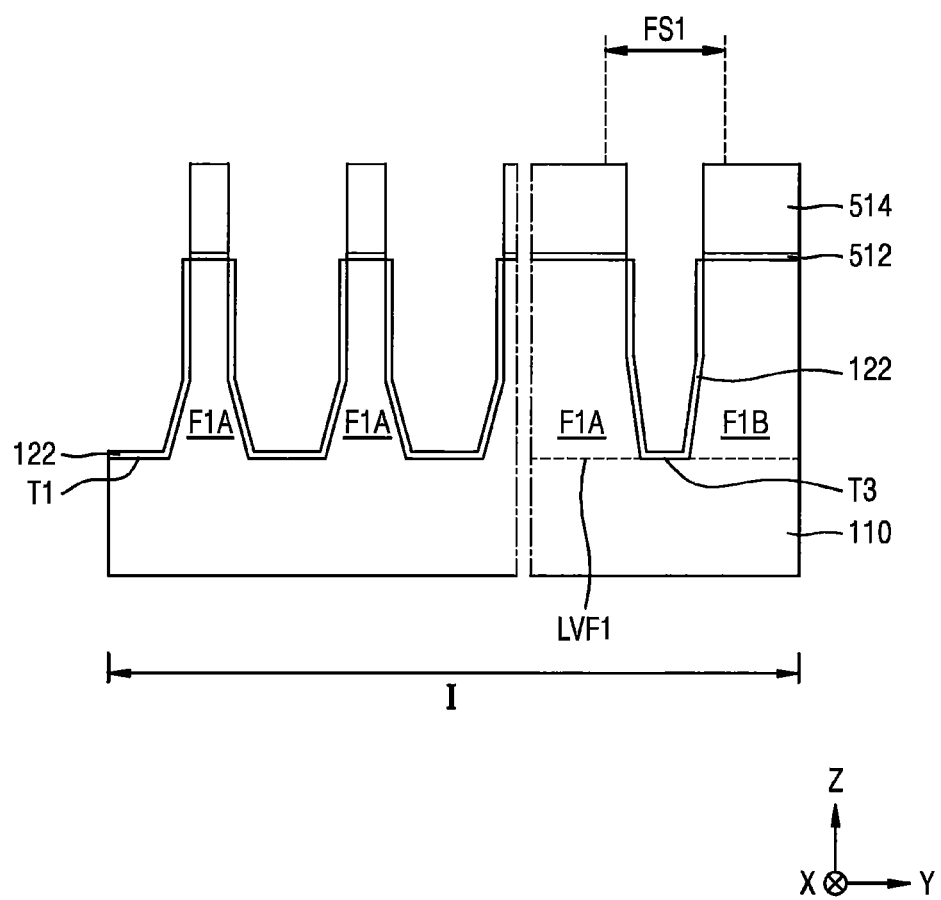
Figure 7B:
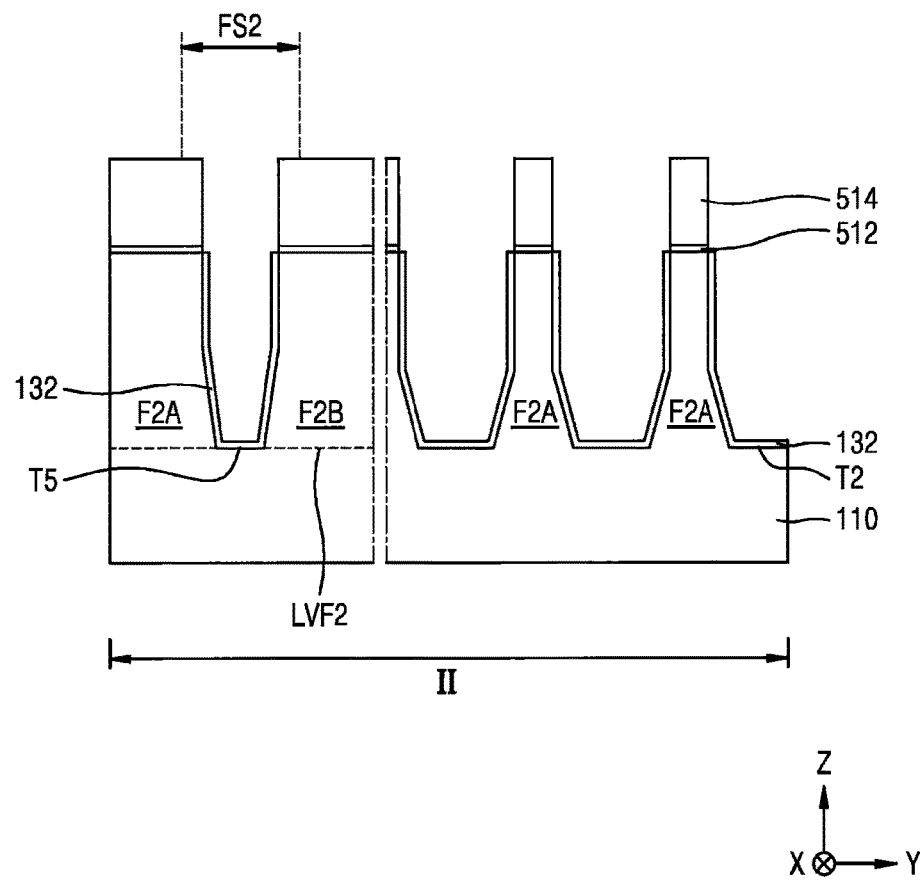

FIGS. 6A, 7A, . . . , 16A each are a cross-sectional view of a portion of the first region I in the integrated circuit device 200 of FIG. 2A. In more detail, FIGS. 6A, 7A, . . . , 16A each are a cross-sectional view of parts corresponding to a portion of a cross section taken along the line 2B-2B' of FIG. 2A and a portion of a cross section taken along the line 2D-2D' of FIG. 2A. FIGS. 6B, 7B, . . . , 16B each are a cross-sectional view of a portion of the second region II in the integrated circuit device 200 of FIG. 2A. In more detail, FIGS. 6B, 7B, . . . , 16B each are a cross-sectional view of parts corresponding to another portion of the cross section taken along the line 2B-2B' of FIG. 2A and a portion of a cross section taken along the line 2E-2E' of FIG. 2A. In FIGS. 6A through 16B, reference numerals that are the same as those of FIGS. 2A through 2E denote the same or similar elements, and thus, their detailed description will be omitted.

Referring to FIGS. 6A and 6B, a plurality of first trenches T1 and a plurality of second trenches T2 may be formed in a first region I of a substrate 110 and a second region II of the substrate 110, respectively, by using a plurality of pad oxide film patterns 512 and a plurality of mask patterns 514 as an etch mask, in a similar way to that described with reference to FIGS. 5A and 5B. In the current embodiment, a fin isolation trench T3 may further be formed in a first fin isolation region FS1 of the first region I, and a fin isolation trench T5 may further be formed in a second fin isolation region FS2 of the second region II.

In some embodiments, the fin isolation trenches T3 and T5 may be simultaneously formed together with the plurality of first and second trenches T1 and T2 by using the plurality of pad oxide film patterns 512 and the plurality of mask patterns 514 as an etch mask. In some embodiments, the fin isolation trenches T3 and T5 may be formed by using a separate etch mask after the plurality of first and second trenches T1 and T2 are formed.

As the plurality of first and second trenches T1 and T2 and the fin isolation trenches T3 and T5 are formed, a plurality of first and second fin-type active regions F1A, F1B, F2A, and F2B, which protrude from the substrate 110 upward in a direction (Z direction) perpendicular to a main surface of the substrate 110 and extend in one direction (X direction), may be obtained.

Referring to FIGS. 7A and 7B, a first insulating liner 122, which covers exposed surfaces of the plurality of first fin-type active regions F1A and F1B, and a second insulating liner 132, which covers exposed surfaces of the plurality of second fin-type active regions F2A and F2B, may be formed in the first region I and the second region II, respectively, in a similar way to that described with reference to FIG. 5C.

In some embodiments, the first insulating liner 122 and the second insulating liner 132 may be simultaneously formed. In some other embodiments, the first insulating liner 122 and the second insulating liner 132 may be sequentially formed. The first insulating liner 122 and the second insulating liner 132 may be formed of the same material formed by the same or similar method. Each of the first and second insulating liners 122 and 132 may have substantially the same thickness or different thicknesses which are selected in the range of about 10 Å to about 100 Å.

Figure 8A:
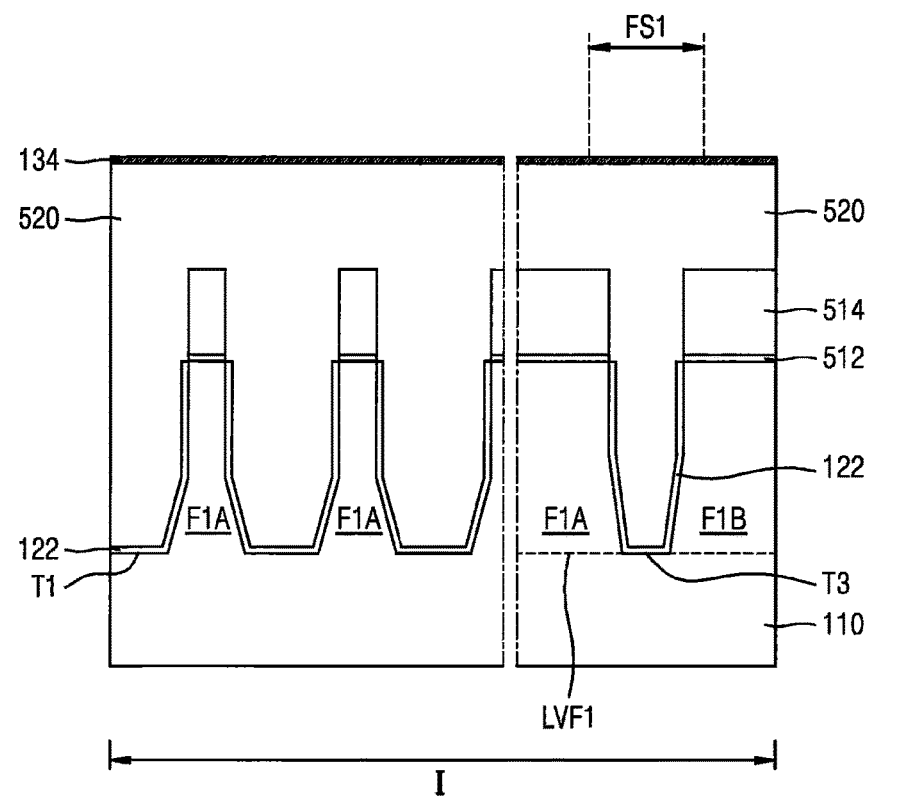
Figure 8B:
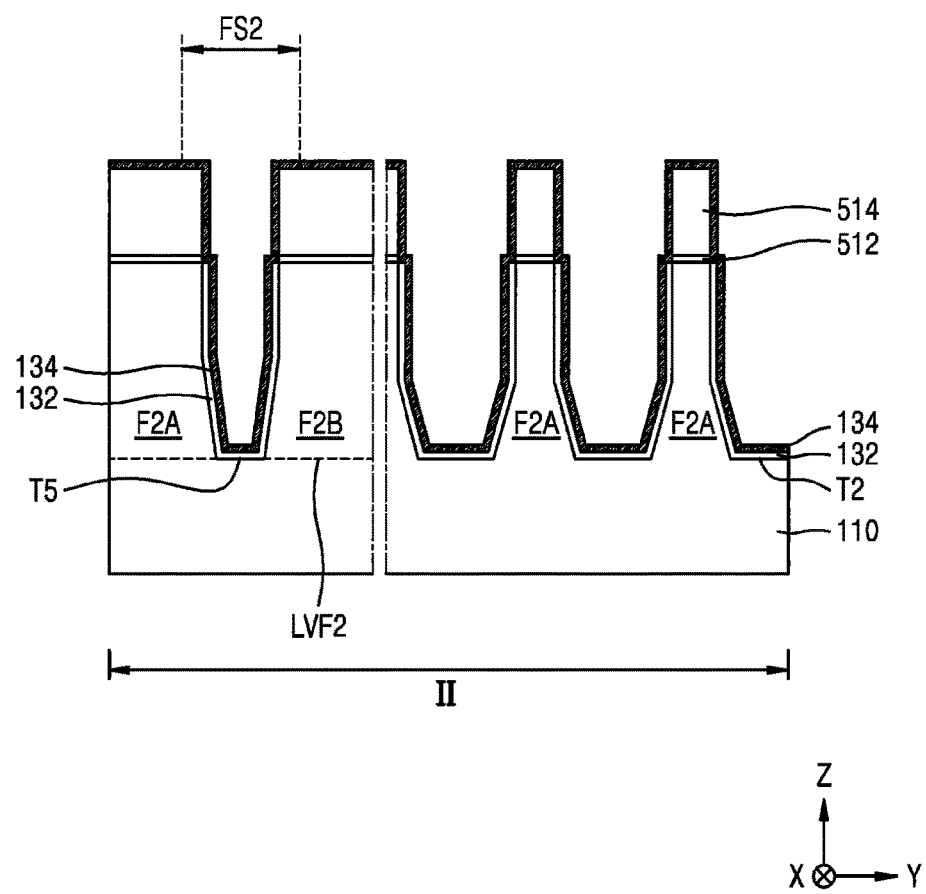

Referring to FIGS. 8A and 8B, a third insulating liner 134 may be formed on the second insulating liner 132 in the second region II after a mask pattern 520 covering the first region I is formed so that the second region II of the substrate 110 is exposed.

The third insulating liner 134 may be formed of a polysilicon film or a nitride film. The third insulating liner 134 may be formed by a CVD or ALD process. In some embodiments, the third insulating liner 134 may have a thickness of about 10 Å to about 100 Å.

Figure 9A:
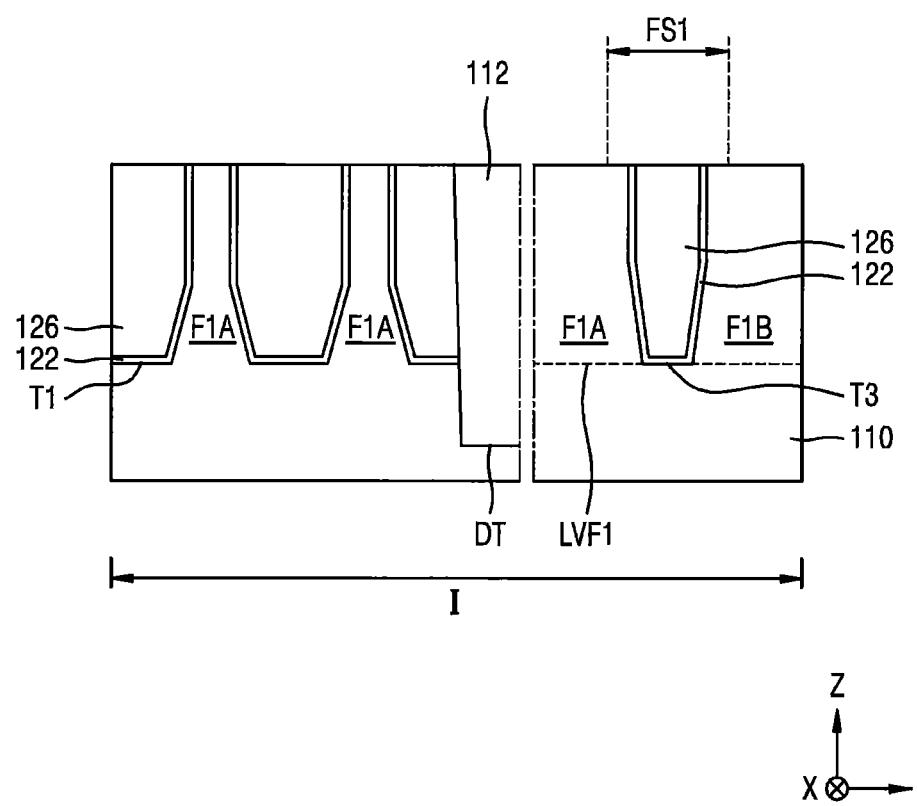
Figure 9B:
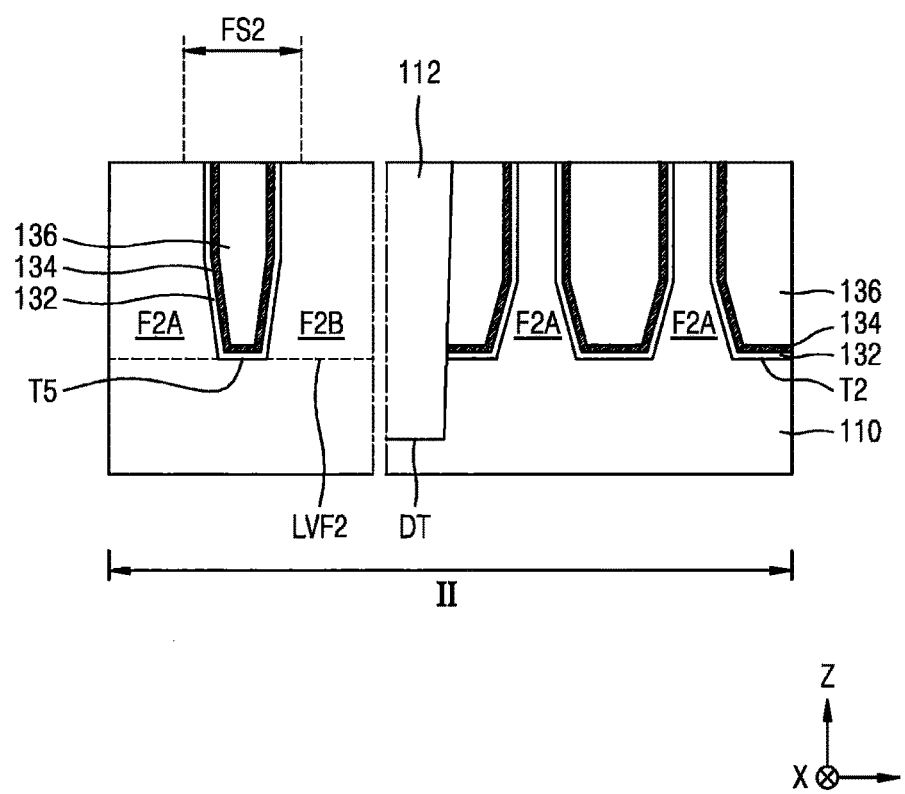

Referring to FIGS. 9A and 9B, a first gapfill insulating layer 126, which fills the plurality of first trenches T1 and the fin isolation trench T3 in the first region I, a second gapfill insulating layer 136, which fills the plurality of second trenches T2 and the fin isolation trench T5 in the second region II, may be formed after the first insulating liner 122 in the first region I is exposed by removing the mask pattern 520 (refer to FIG. 8A). Next, a deep trench DT may be formed and then an insulating layer 112 for device region isolation, which fills the deep trench DT, is formed. The first and second gapfill insulating layers 126 and 136, the deep trench DT, and the insulating layer 112 may be formed in a similar way to that described with reference to FIGS. 5E through 5G.

Thereafter, a planarization process can be performed on an obtained resultant structure so that an upper surface of each of the first and second fin-type active regions F1A, F1B, F2A, and F2B is exposed, and thus, the plurality of pad oxide film patterns 512 and the plurality of mask patterns 514 may be removed, and a level of an upper surface of each of the first and second gapfill insulating layers 126 and 136 and a level of an upper surface of the third insulating liner 134 may be lowered.

In some other embodiments, the plurality of pad oxide film patterns 512 may remain without being completely removed unlike in FIGS. 9A and 9B so that the plurality of pad oxide film patterns 512 covering the upper surfaces of the plurality of first and second fin-type active regions F1A, F1B, F2A, and F2B may be exposed after the planarization process.

Figure 10A:
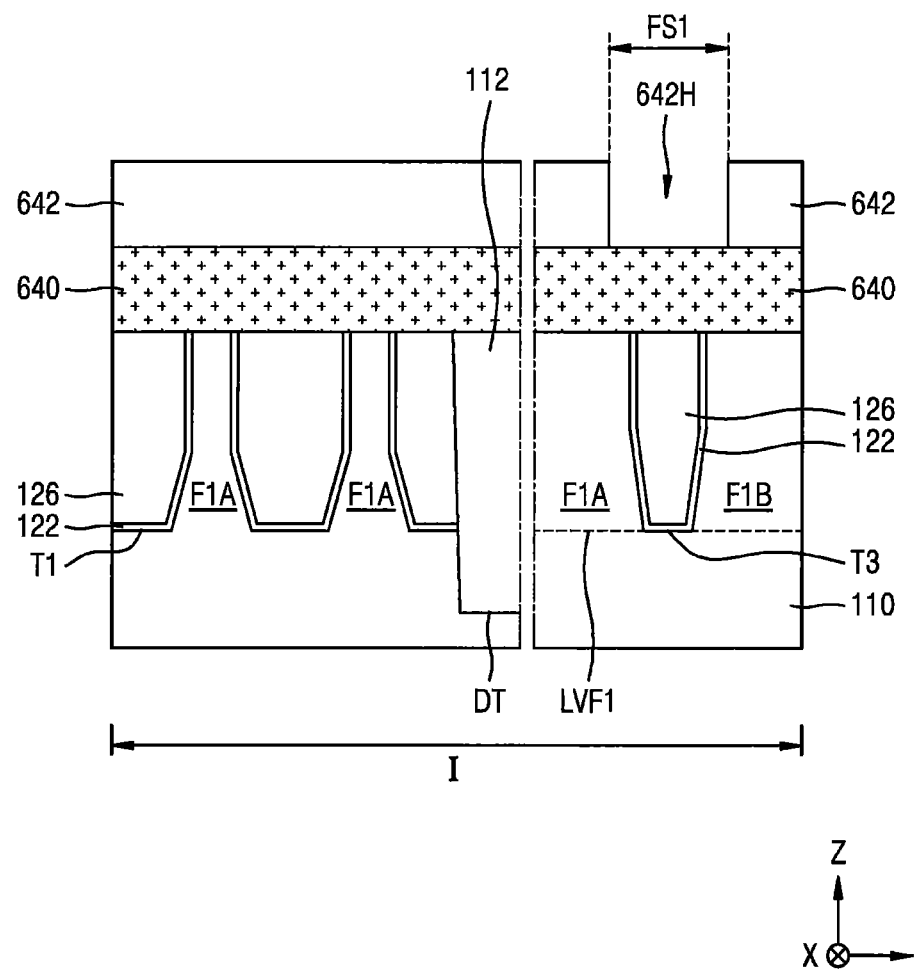
Figure 10B:
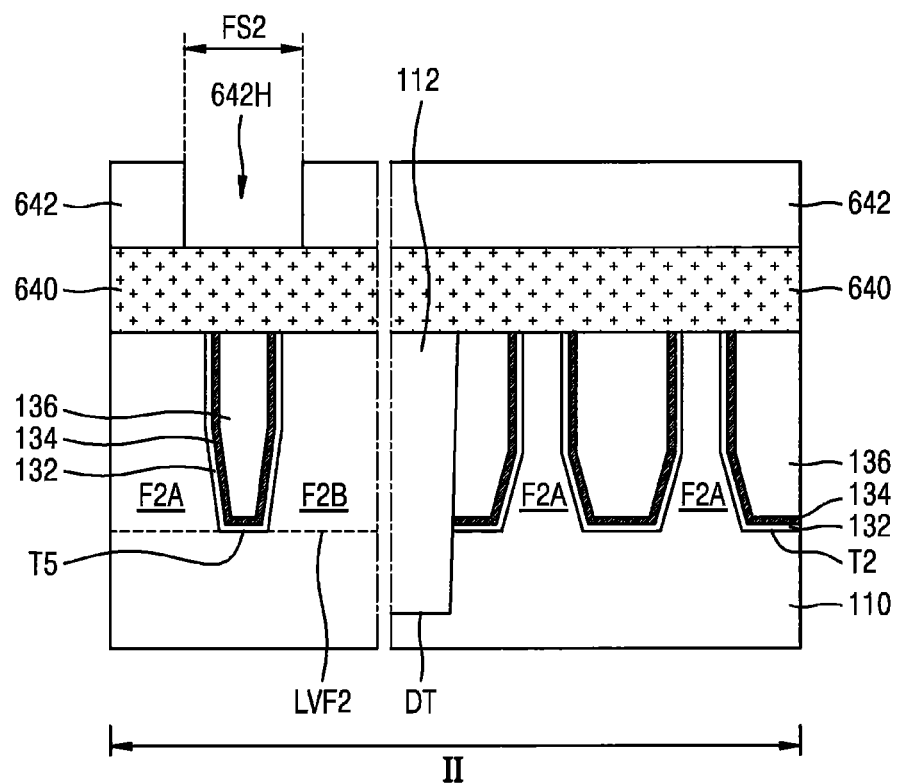
Figure 10B:
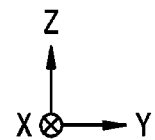

Referring to FIGS. 10A and 10B, a hard mask layer 640 may be formed on a resultant structure including the plurality of first and second fin-type active regions F1A, F1B, F2A, and F2B and the planarized first and second gapfill insulating layers 126 and 136, and a mask pattern 642, which has an opening 642H exposing the hard mask layer 640 in the first and second fin isolation regions FS1 and FS2, may be formed.

The hard mask layer 640 may be formed of a material having etch selectivity with respect to the plurality of first and second fin-type active regions F1A, F1B, F2A, and F2B and the planarized first and second gapfill insulating layers 126 and 136. For example, the hard mask layer 640 may be formed of nitride, SOH, or a combination thereof, but is not limited thereto.

The mask pattern 642 may be a photoresist pattern, but is not limited thereto.

Figure 11A:
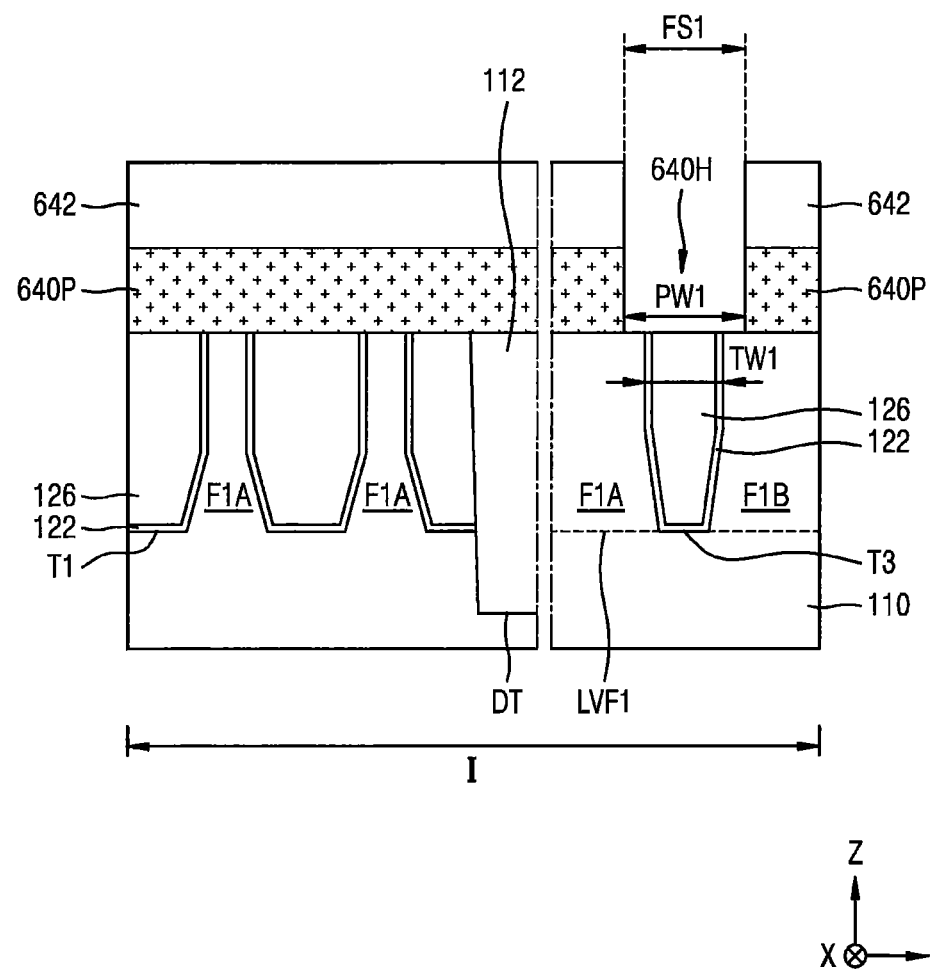
Figure 11B:
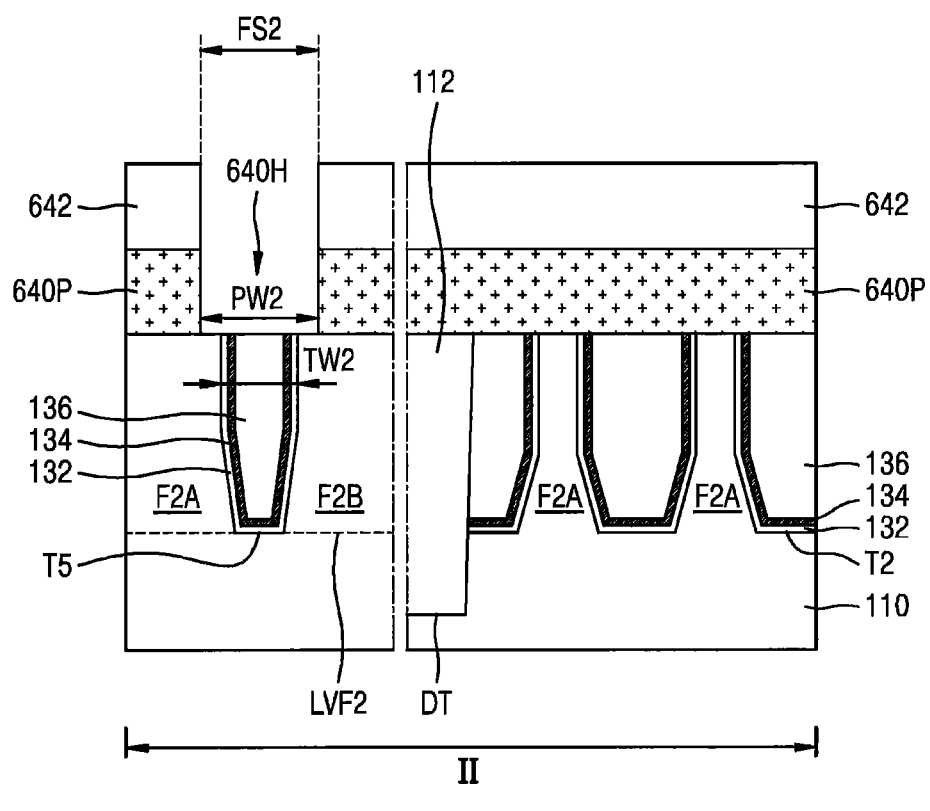

Referring to FIGS. 11A and 11B, the hard mask layer 640 may be etched by using the mask pattern 642 as an etch mask to thereby form a hard mask pattern 640P having an opening 640H.

In the first region I of the substrate 110, the width PW1 of the opening 640H of the hard mask pattern 640P may be larger than the width TW1 of the fin isolation trench T3. In the second region II of the substrate 110, the width PW2 of the opening 640H of the hard mask pattern 640P may be larger than the width TW2 of the fin isolation trench T5.

In the first region I, the first insulating liner 122 and the first gapfill insulating layer 126, which fill the fin isolation trench T3, and the first fin-type active regions F1A and F1B around them may be exposed through the opening 640H of the hard mask pattern 640P. In the second region II, the second insulating liner 132, the third insulating liner 134, and the second gapfill insulating layer 136, which fill the fin isolation trench T5, and the second fin-type active regions F2A and F2B around them may be exposed through the opening 640H of the hard mask pattern 640P.

Figure 12A:
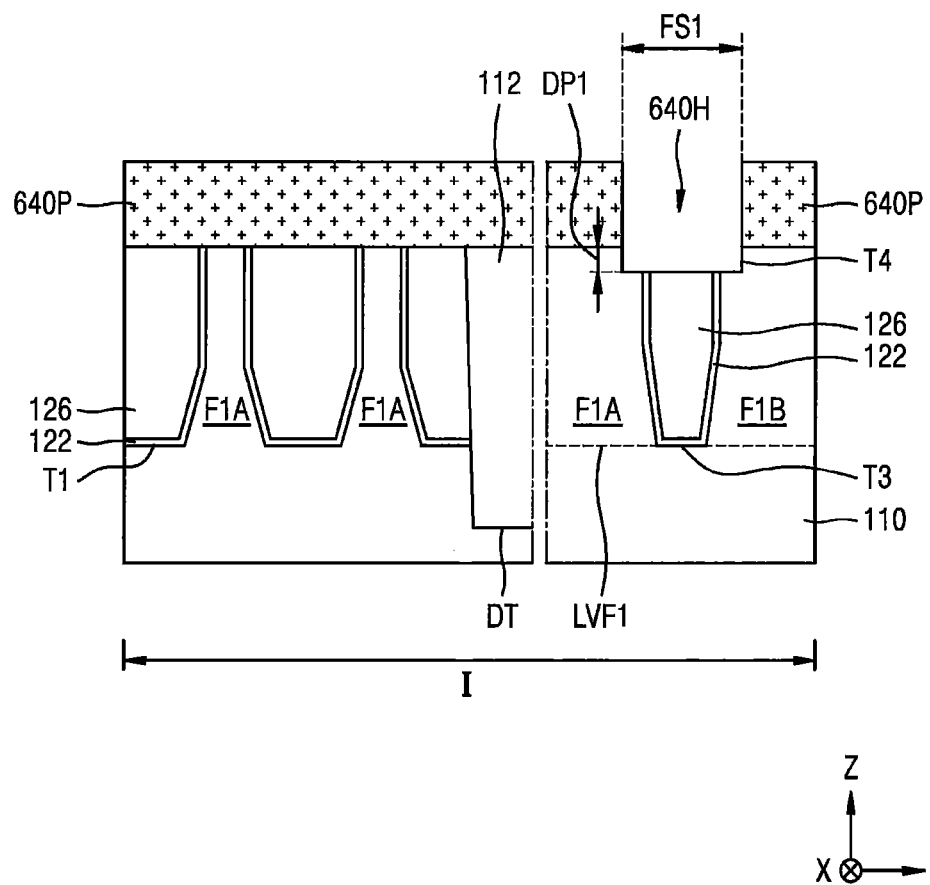
Figure 12B:
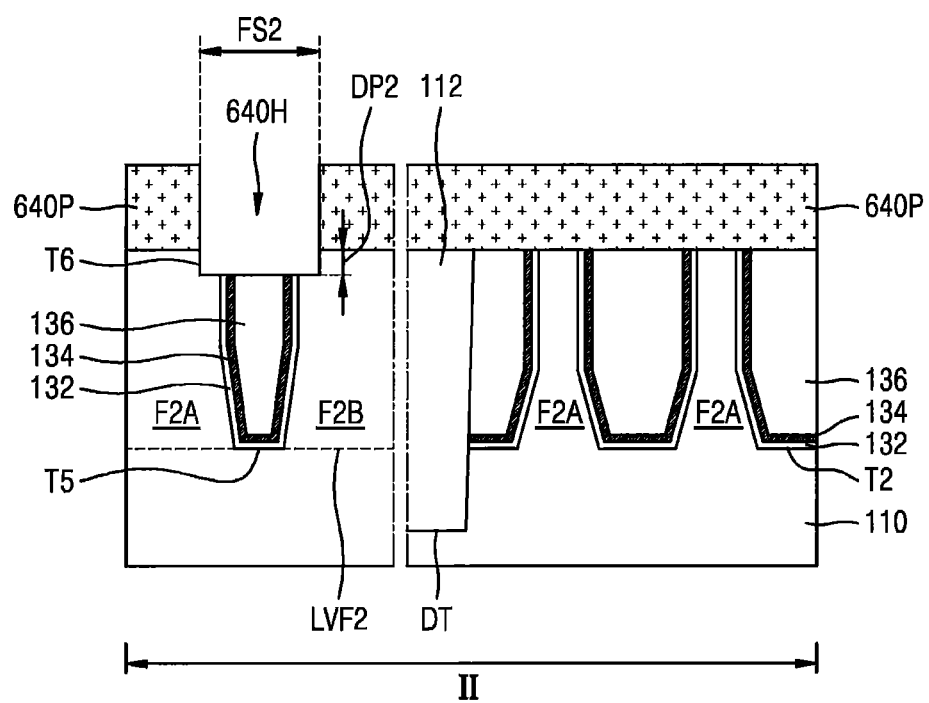

Referring to FIGS. 12A and 12B, a portion of each of the first and second fin-type active regions F1A, F1B, F2A, and F2B, which is exposed through the opening 640H in the first region I and the second region II, and a portion of each of layers filling the fin isolation trenches T3 and T5 may be removed by using the hard mask pattern 640P as an etch mask, and thus, upper trenches T4 and T6 communicating with the fin isolation trenches T3 and T5 may be formed.

In the first region I, the upper trench T4 may be formed to be recessed by a first depth DP1 from the upper surface of each of the plurality of first fin-type active regions F1A and F1B. In the second region II, the upper trench T6 may be formed to be recessed by a second depth DP2 from the upper surface of each of the plurality of second fin-type active regions F2A and F2B.

In the resultant structure of FIGS. 11A and 11B, the mask pattern 642 covering the hard mask pattern 640P may be removed before the upper trenches T4 and T6 are formed or after the upper trenches T4 and T6 are formed. Accordingly, after the upper trenches T4 and T6 are formed, the upper surface of the hard mask pattern 640P may be exposed.

Figure 13A:
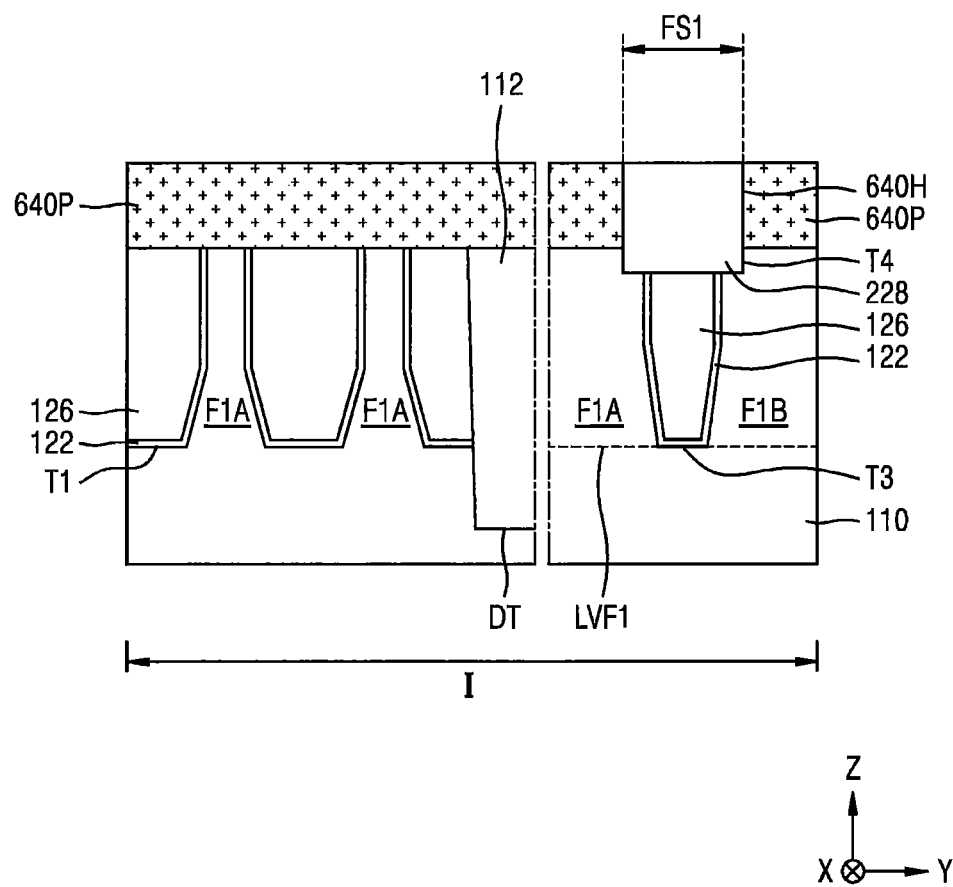
Figure 13B:
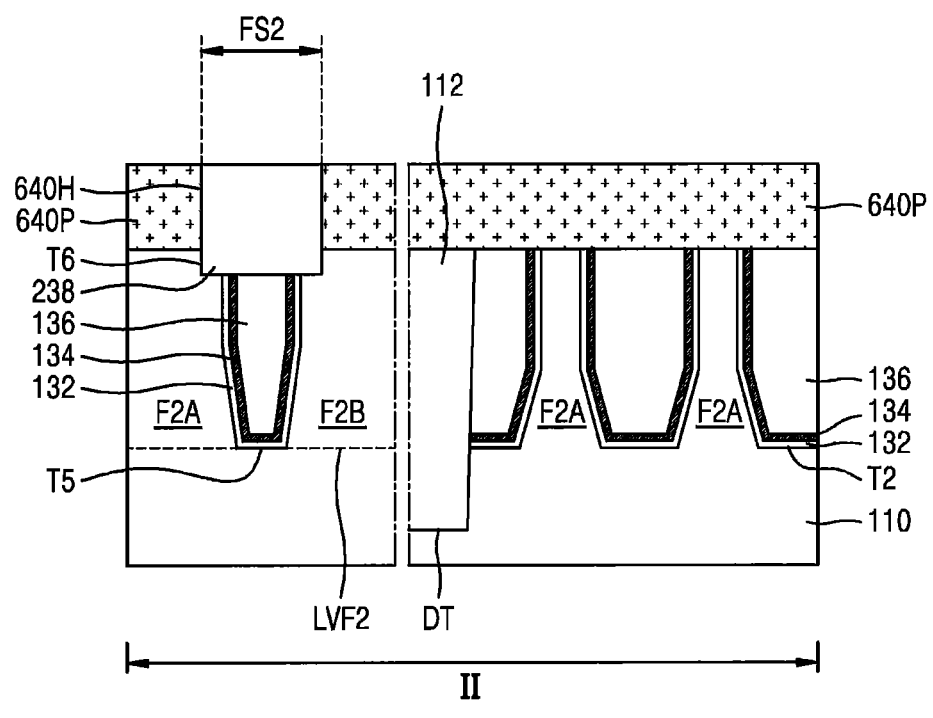

Referring to FIGS. 13A and 13B, first and second upper buried layers 228 and 238 filling the opening 640H of the hard mask pattern 640P and the upper trenches T4 and T6 may be formed.

In some embodiments, in order to form the first and second upper buried layers 228 and 238, an insulating layer, which covers the insides of the upper trenches T4 and T6 and the upper surface of the hard mask pattern 640P, may be formed and then may be planarized so that the upper surface of the hard mask pattern 640P is exposed. As a result, the first and second upper buried layers 228 and 238 may remain in the upper trenches T4 and T6 and the opening 640H of the hard mask pattern 640P.

In the Y direction, the widths of the first and second upper buried layers 228 and 238 may be larger than those of the fin isolation trenches T3 and T5.

In some embodiments, the first and second upper buried layers 228 and 238 may be formed of FSG, USG, BPSG, PSG, FOX, PE-TEOS, or TOSZ. In some embodiments, the first and second upper buried layers 228 and 238, the first gapfill insulating layer 126, and the second gapfill insulating layer 136 may be formed of the same material. In some other embodiments, the first gapfill insulating layer 126 and the second gapfill insulating layer 136 may be formed of the same material, and the first and second upper buried layers 228 and 238 may be formed of a material that is different from a constituent material of the first and second gapfill insulating layers 126 and 136.

Figure 14A:
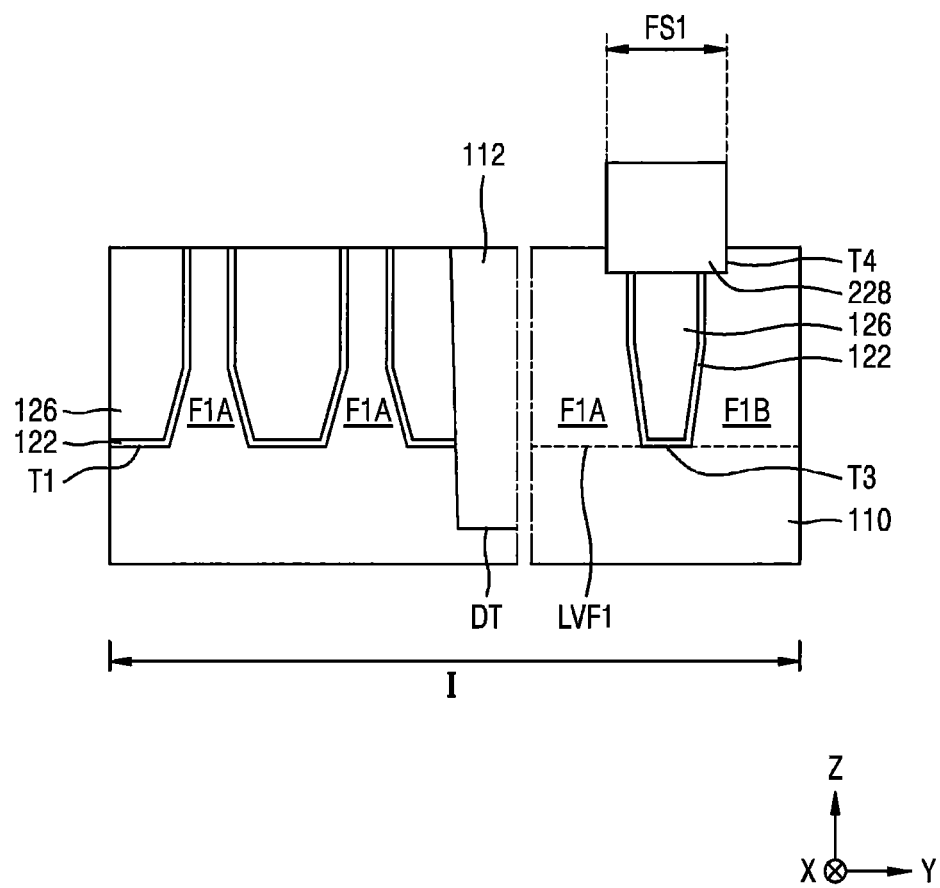
Figure 14B:
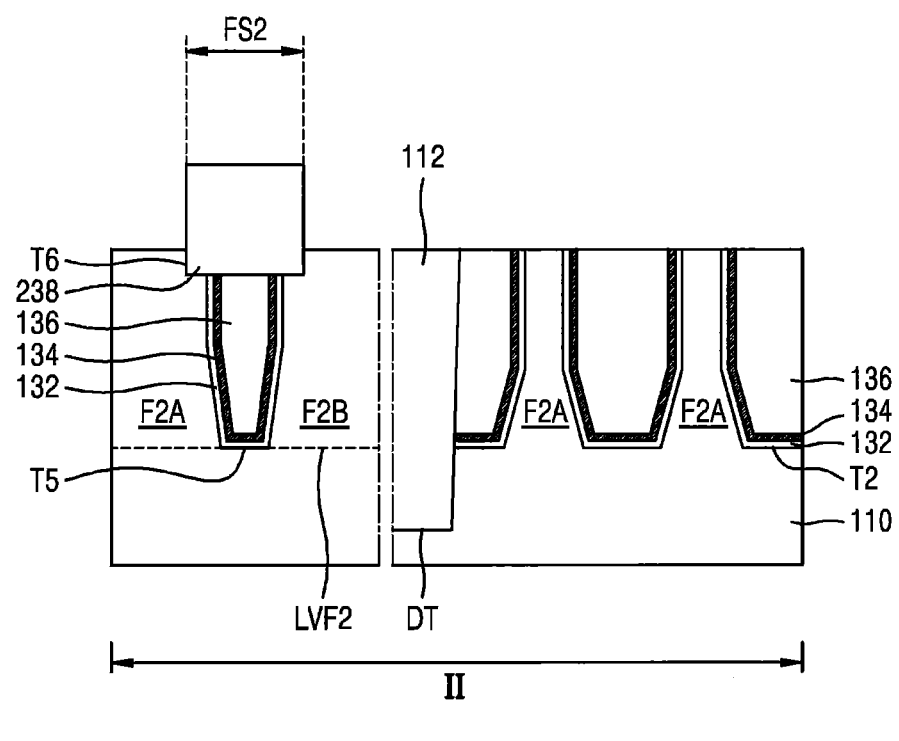

Referring to FIGS. 14A and 14B, the hard mask pattern 640P may be removed from the resultant structure of FIGS. 13A and 13B to thereby expose the upper surface of each of the first and second fin-type active regions F1A, F1B, F2A, and F2B.

Figure 15A:
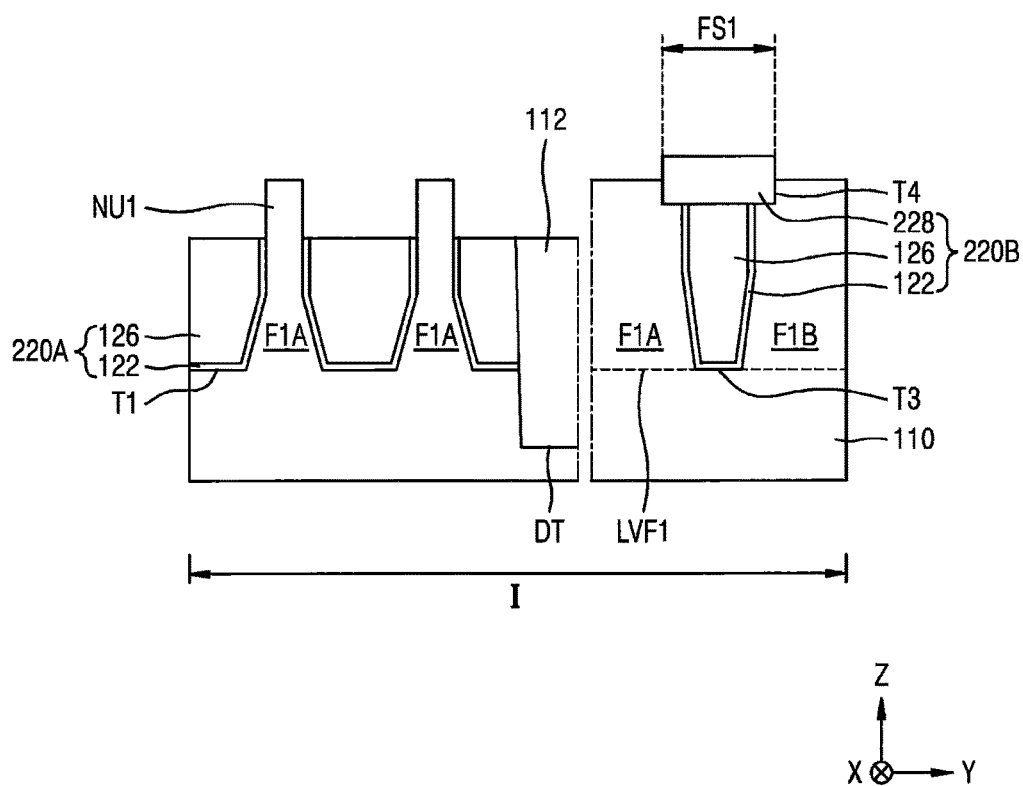
Figure 15B:
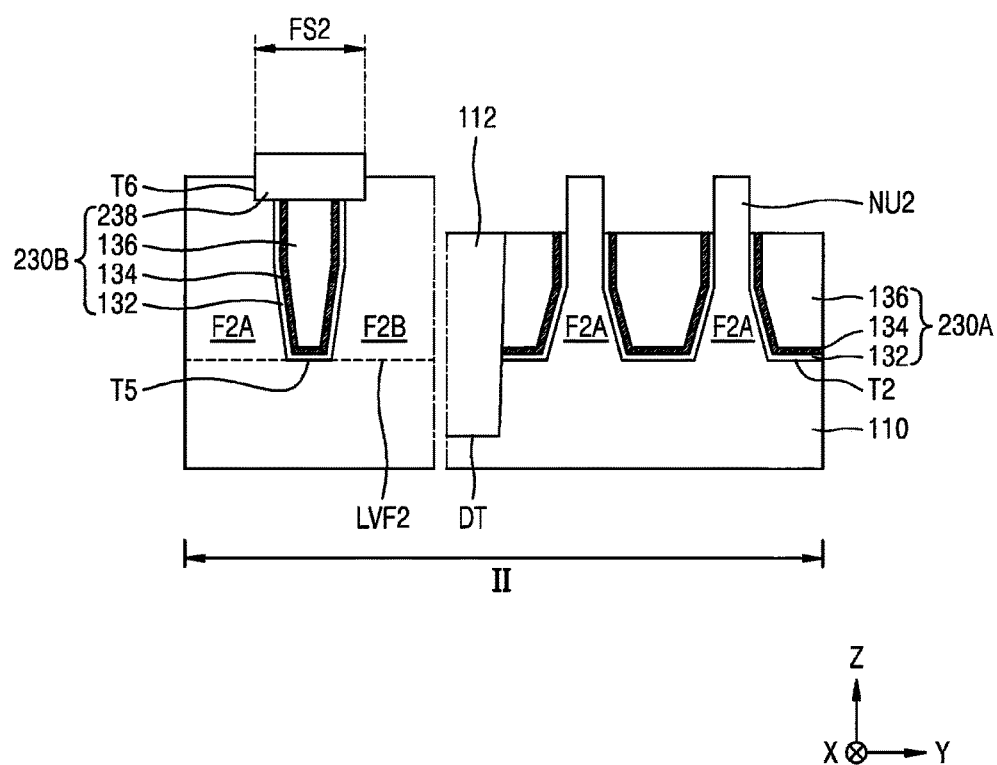

Referring to FIGS. 15A and 15B, a portion of the insulating layer 112 for device region isolation, a portion of each of the first and second gapfill insulating layers 126 and 136, a portion of the third insulating liner 134, and a portion of each of the first and second insulating liners 122 and 132 may be removed from the resultant structure of FIGS. 14A and 14B so that an upper surface and sidewalls of an upper portion of each of the plurality of first and second fin-type active regions F1A, F1B, F2A, and F2B are exposed, in a similar way to that described with reference to FIG. 5H. In this case, an upper portion of each of the first and second buried layers 228 and 238 in the first and second fin isolation regions FS1 and FS2 may be removed and thus the heights of the first and second buried layers 228 and 238 may be lowered.

As a result, a low level first device isolation layer 220A and a high level first device isolation layer 220B may remain in the first region I, and a low level second device isolation layer 230A and a high level second device isolation layer 230B may remain in the second region II. Accordingly, in the first region I, an upper portion NU1 of each of the plurality of first fin-type active regions F1A and F1B may protrude and be exposed on the low level first device isolation layer 220A. In the second region II, an upper portion NU2 of each of the plurality of second fin-type active regions F2A and F2B may protrude and be exposed on the low level second device isolation layer 230A.

In some embodiments, an impurity ion implantation process for threshold voltage adjustment may be performed on the exposed upper portions NU1 and NU2 of the plurality of first and second fin-type active regions F1A, F1B, F2A, and F2B. In the impurity ion implantation process for threshold voltage adjustment, boron (B) ions may be injected as impurities in a region, in which an NMOS transistor is formed, from among the first region I and the second region II, and phosphorus (P) ions or arsenic (As) ions may be injected as impurities in a region, in which a PMOS transistor is formed, from among the first region I and the second region II.

Figure 16A:
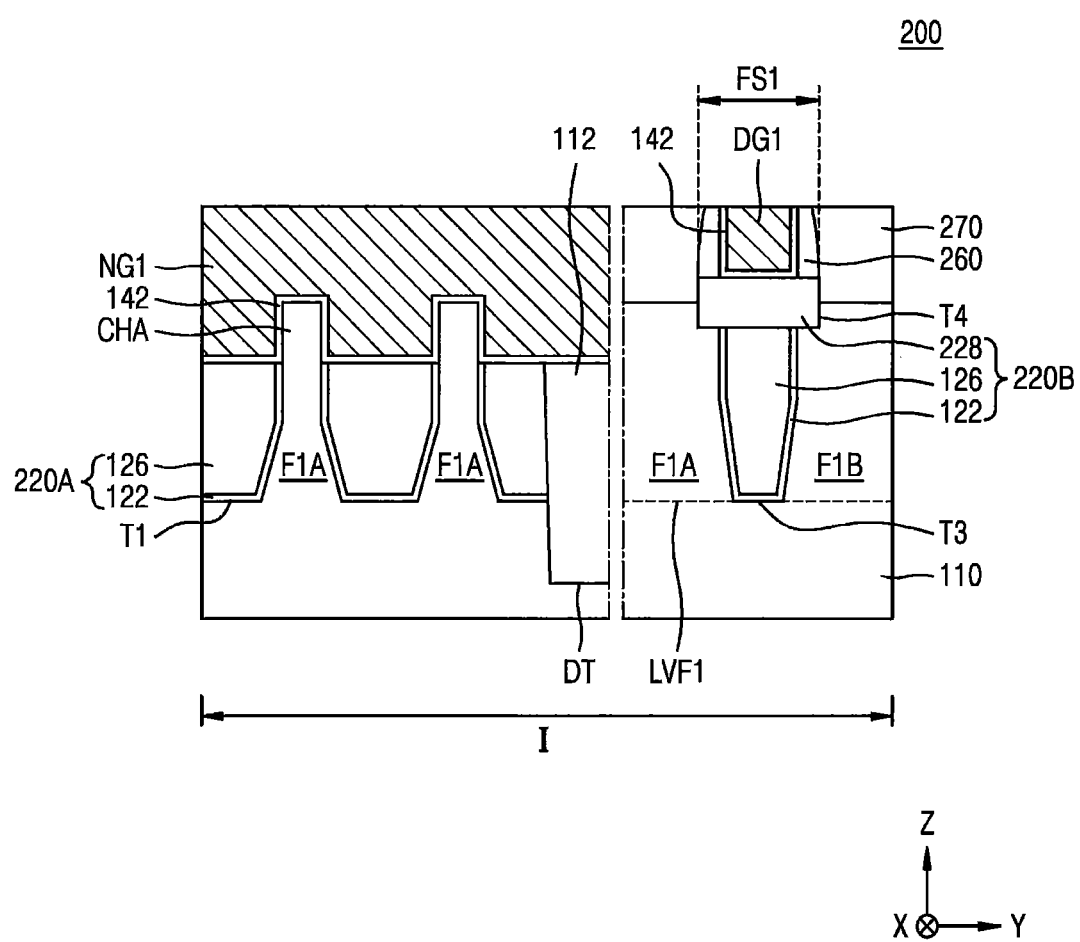
Figure 16B:
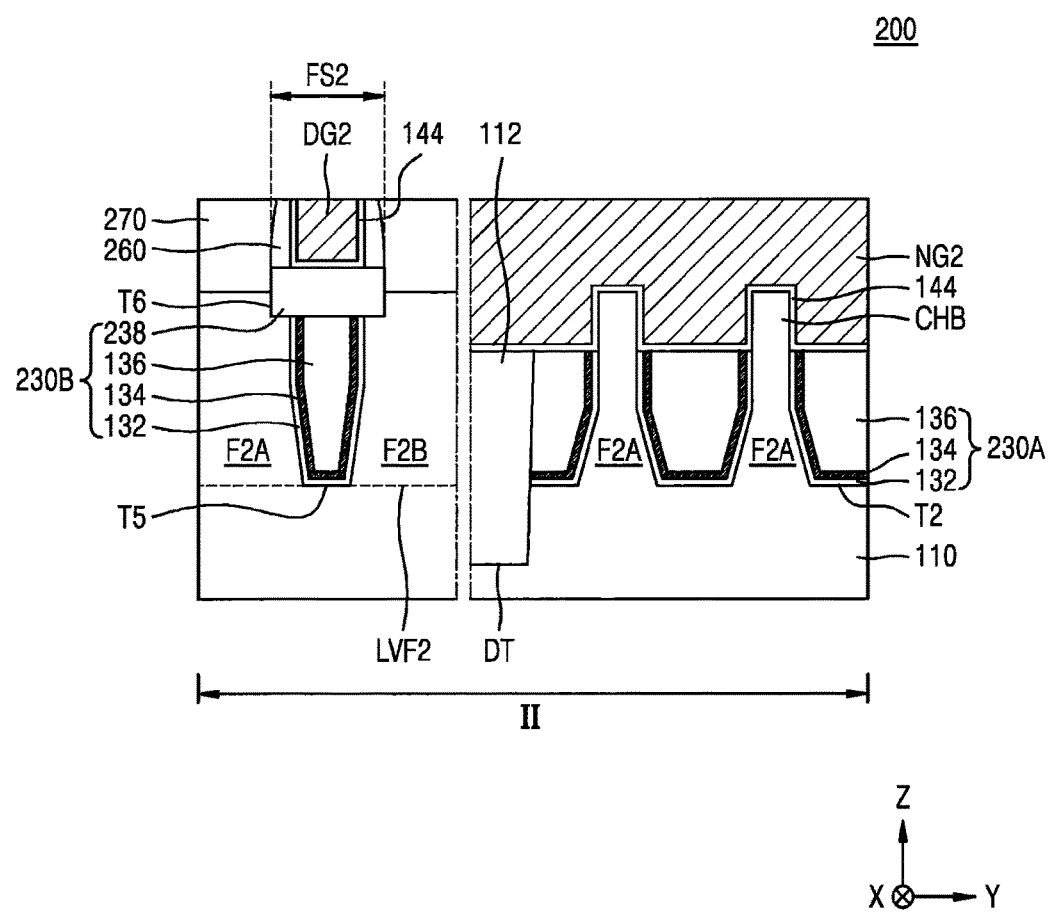

Referring to FIGS. 16A and 16B, a first gate insulating film 142 and a normal gate NG1, which sequentially cover the exposed upper portion NU1 (refer to FIG. 15A) of each of the plurality of first fin-type active regions F1A and F1B, may be formed in the first region I, and a second gate insulating film 144 and a normal gate NG2, which sequentially cover the exposed upper portion NU2 (refer to FIG. 15B) of each of the plurality of second fin-type active regions F2A and F2B, may be formed in the second region II.

While the first gate insulating film 142 and the normal gate NG1 are formed in the first region I, the first gate insulating film 142 and a dummy gate DG1 may also be formed on the first upper buried layer 228 in the first fin isolation region FS1. While the second gate insulating film 144 and the normal gate NG2 are formed in the second region II, the second gate insulating film 144 and a dummy gate DG2 may also be formed on the second upper buried layer 238 in the second fin isolation region FS2.

In addition, a first source/drain region 282 (refer to FIG. 2D) may be formed, at both sides of the normal gate NG1, in each of the plurality of first fin-type active regions F1A and F1B, and a second source/drain region 284 (refer to FIG. 2E) may be formed, at both sides of the normal gate NG2, in each of the plurality of second fin-type active regions F2A and F2B. Accordingly, the integrated circuit device 200 illustrated in FIGS. 2A through 2E may be obtained.

In some embodiments, the normal gates NG1 and NG2 and the dummy gates DG1 and DG2 may be formed by an RPG process. The upper portion NU1 of each of the plurality of first fin-type active regions F1A and F1B may become a channel region CHA, and the upper portion NU2 of each of the plurality of second fin-type active regions F2A and F2B may become a channel region CHB.

In some embodiments, in order to form the normal gates NG1 and NG2 and the dummy gates DG1 and DG2 by using the RPG process, a plurality of insulating spacers 260, which provide a plurality of gate spaces, and an inter-gate insulating layer 270 may be formed first. Thereafter, the first and second insulating films 142 and 144, the normal gates NG1 and NG2, and the dummy gates DG1 and DG2 may be formed in the plurality of gate spaces that are defined by the plurality of insulating spacers 260.

Although the methods of manufacturing the integrated circuit device 200 illustrated in FIGS. 2A through 2E are described with reference to FIGS. 6A through 16B above, it will be obvious to one of ordinary skill in the art that the integrated circuit device 300 illustrated in FIGS. 3A and 3B and the integrated circuit device 400 illustrated in FIGS. 4A and 4B may be manufactured through various modifications and changes within the scope of the inventive concepts.

According to the methods of manufacturing the integrated circuit device 200, described with reference to FIGS. 6A through 16B, there is provided a device isolation layer structure having different structures in the first and second regions I and II. In other words, in the second region II, each of the second device isolation layers 230A and 230B includes the third insulating liner 134 between the second insulating liner 132 and the second gapfill insulating layer 136. On the other hand, in the first region I, each of the first device isolation layers 220A and 220B does not include the third insulating liner 134. Accordingly, an integrated circuit device, in which carrier mobility is improved independently according to conductive types of the channel regions CHA and CHB formed in the first and second regions I and II, may be obtained by forming the first device isolation layers 220A and 220B and the second device isolation layers 230A and 230B, which have different structures in the first region I and the second region II, by using a simplified process.

Figure 17:
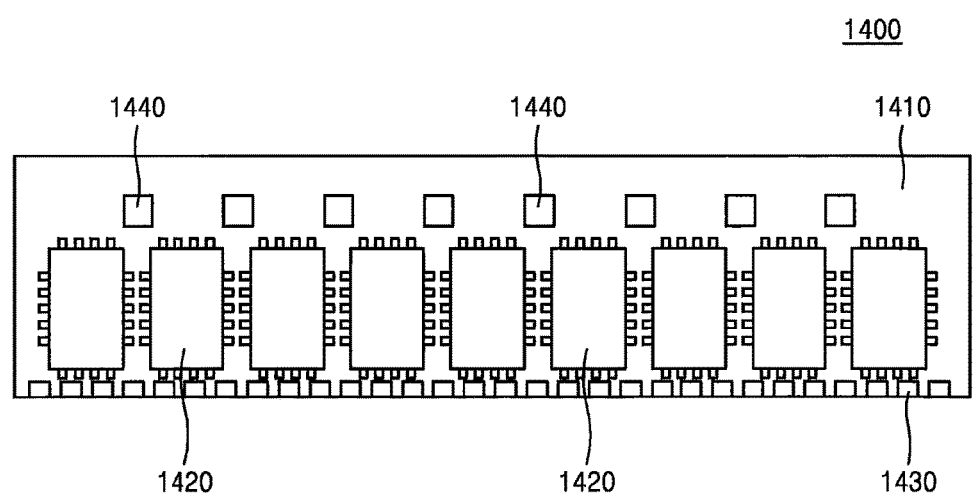
FIG. 17 is a plan view of memory modules according to an example embodiment of the inventive concepts.

FIG. 17 is a plan view of a memory module 1400 according to an example embodiment of the inventive concepts.

The memory module 1400 may include a module substrate 1410 and a plurality of semiconductor chips 1420 attached to the module substrate 1410.

The semiconductor chips 1420 may include an integrated circuit device according to the inventive concepts. The semiconductor chips 1420 may include at least one of the integrated circuit devices 100, 200, 300, and 400 according to the example embodiments of the inventive concepts described with reference to FIGS. 1A through 16B or at least one of integrated circuit devices modified or changed from the integrated circuit devices 100, 200, 300, and 400.

A connection unit 1430 that may be inserted into a socket of a motherboard may be disposed at one side of the module substrate 1410. A ceramic decoupling capacitor 1440 may be disposed on the module substrate 1410. The memory module 1400 according to the inventive concepts is not limited to the embodiment illustrated in FIG. 17 but may be manufactured in various forms.

Figure 18:
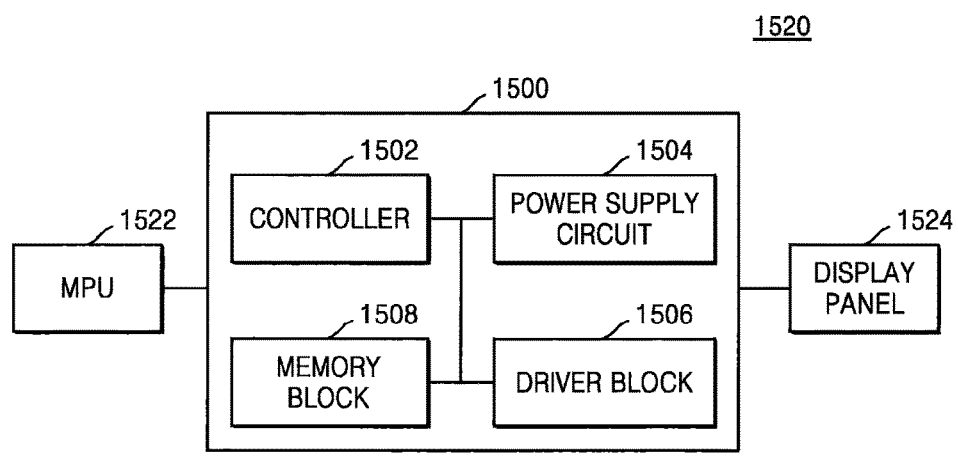
FIG. 18 is a schematic block diagram of a displayer driver IC (DDI) and a display apparatus including the DDI according to an example embodiment of the inventive concepts.

FIG. 18 is a schematic block diagram of a displayer driver IC (DDI) 1500 and a display apparatus 1520 including the DDI 1500 according to an example embodiment of the inventive concepts.

Referring to FIG. 18, the DDI 1500 may include a controller 1502, a power supply circuit 1504, a driver block 1506, and a memory block 1508. The controller 1502 may receive and decode a command applied from a main processing unit (MPU) 1522, and control each block of the DDI 1500 to perform an operation according to the command. The power supply circuit unit 1504 may generate a driving voltage in response to the control of the controller 1502. The driver block 1506 may drive a display panel 1524 by using the driving voltage generated by the power supply circuit unit 1504 in response to the control of the controller 1502. The display panel 1524 may be a liquid crystal display panel, a plasma display panel, or an organic light emitting diode (OLED) panel. The memory block 1508 may be a block that temporarily stores the command input to the controller 1502 or control signals output from the controller 1502 or stores data, and may include a memory such as random-access memory (RAM) or read-only memory (ROM). At least one selected from the power supply circuit unit 1504 and the driver block 1506 may include at least one of the integrated circuit devices 100, 200, 300, and 400 according to the example embodiments of the inventive concepts described with reference to FIGS. 1A through 16B or at least one of the integrated circuit devices modified or changed from the integrated circuit devices 100, 200, 300, and 400.

Figure 19:
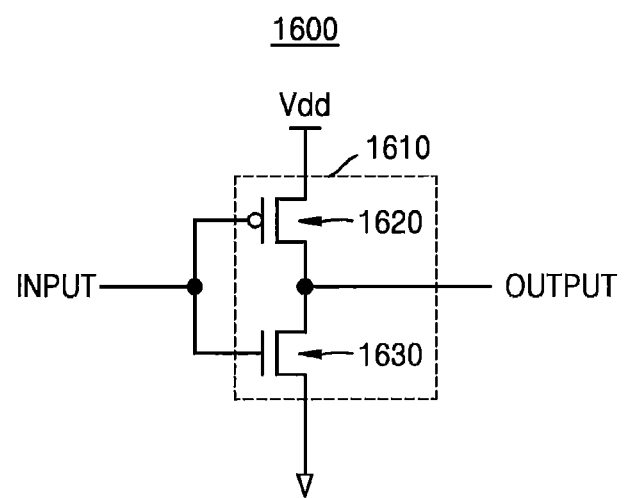
FIG. 19 is a circuit diagram of a complementary metal-oxide semiconductor (CMOS) inverter according to an example embodiment of the inventive concepts.

FIG. 19 is a circuit diagram of a complementary metal-oxide semiconductor (CMOS) inverter 1600 according to an example embodiment of the inventive concepts.

The CMOS inverter 1600 may include a CMOS transistor 1610. The CMOS transistor 1610 may include a PMOS transistor 1620 and an NMOS transistor 1630 that are connected between a power terminal Vdd and a ground terminal. The CMOS transistor 1610 may include at least one of the integrated circuit devices 100, 200, 300, and 400 according to the example embodiments of the inventive concepts described with reference to FIGS. 1A through 16B or at least one of integrated circuit devices modified or changed from the integrated circuit devices 100, 200, 300, and 400.

Figure 20:
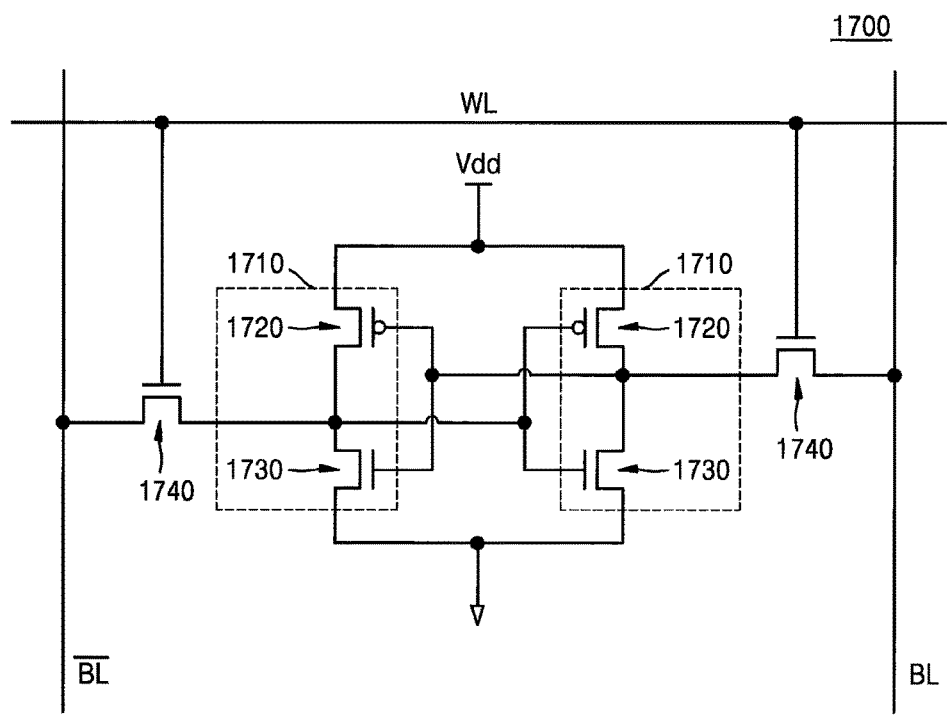
FIG. 20 is a circuit diagram of a CMOS static random-access memory (SRAM) device according to an example embodiment of the inventive concepts.

FIG. 20 is a circuit diagram of a CMOS static RAM (SRAM) device 1700 according to an example embodiment of the inventive concepts.

The CMOS SRAM device 1700 may include a pair of driving transistors 1710. Each of the pair of driving transistors 1710 may include a PMOS transistor 1720 and an NMOS transistor 1730 that are connected between the power terminal Vdd and a ground terminal. The CMOS SRAM device 1700 may further include a pair of transmission transistors 1740. A source of the transmission transistors 1740 may be cross-connected to a common node of the PMOS transistor 1720 and the NMOS transistor 1730 of the driving transistor 1710. The power terminal Vdd may be connected to a source of the PMOS transistor 1720, and the ground terminal may be connected to a source of the NMOS transistor 1730. A word line WL may be connected to gates of the pair of transmission transistors 1740, and a bit line BL and an inverted bit line $\overline{BL}$ may be respectively connected to respective drains of the pair of transmission transistors 1740.

At least one of the CMOS SRAM device 1700 and the driving transistors 1710 and the transmission transistors 1740 may include at least one of the integrated circuit devices 100, 200, 300, and 400 according to the example embodiments of the inventive concepts described with reference to FIGS. 1A through 16B or at least one of integrated circuit devices modified or changed from the integrated circuit devices 100, 200, 300, and 400.

Figure 21:
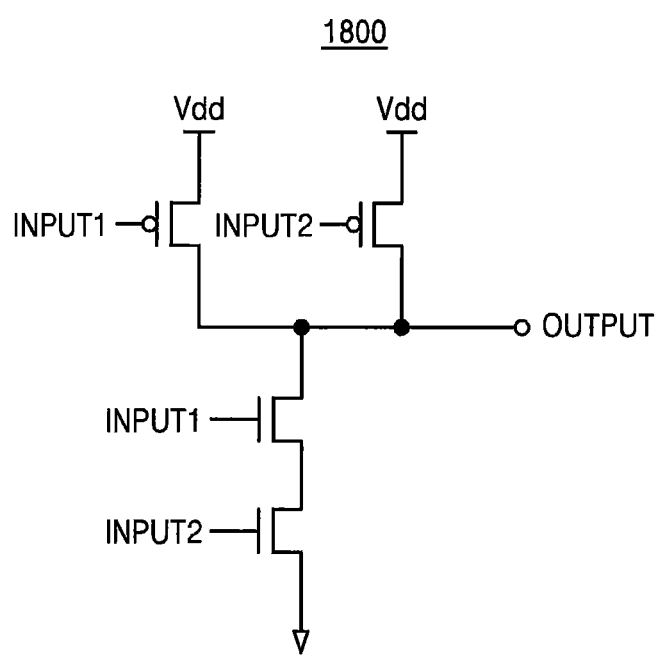
FIG. 21 is a circuit diagram of a CMOS NAND circuit according to an example embodiment of the inventive concepts.

FIG. 21 is a circuit diagram of a CMOS NAND circuit 1800 according to an example embodiment of the inventive concepts.

The CMOS NAND circuit 1800 may include a pair of CMOS transistors to which different input signals are transmitted. The CMOS NAND circuit 1800 may include at least one of the integrated circuit devices 100, 200, 300, and 400 according to the example embodiments of the inventive concepts described with reference to FIGS. 1A through 16B or at least one of integrated circuit devices modified or changed from the integrated circuit devices 100, 200, 300, and 400.

Figure 22:
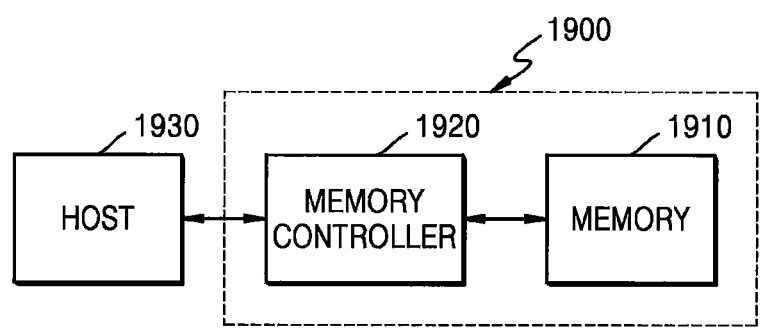
FIG. 22 is a block diagram of electronic systems according to an example embodiment of the inventive concepts.

FIG. 22 is a block diagram of an electronic system 1900 according to an example embodiment of the inventive concepts.

The electronic system 1900 may include a memory 1910 and a memory controller 1920. The memory controller 1920 may control the memory 1910 to read and/or write data from or to the memory 1910 in response to a request of a host 1930. At least one of the memory 1910 and the memory controller 1920 may include at least one of the integrated circuit devices 100, 200, 300, and 400 according to the example embodiments of the inventive concepts described with reference to FIGS. 1A through 16B or at least one of integrated circuit devices modified or changed from the integrated circuit devices 100, 200, 300, and 400.

Figure 23:
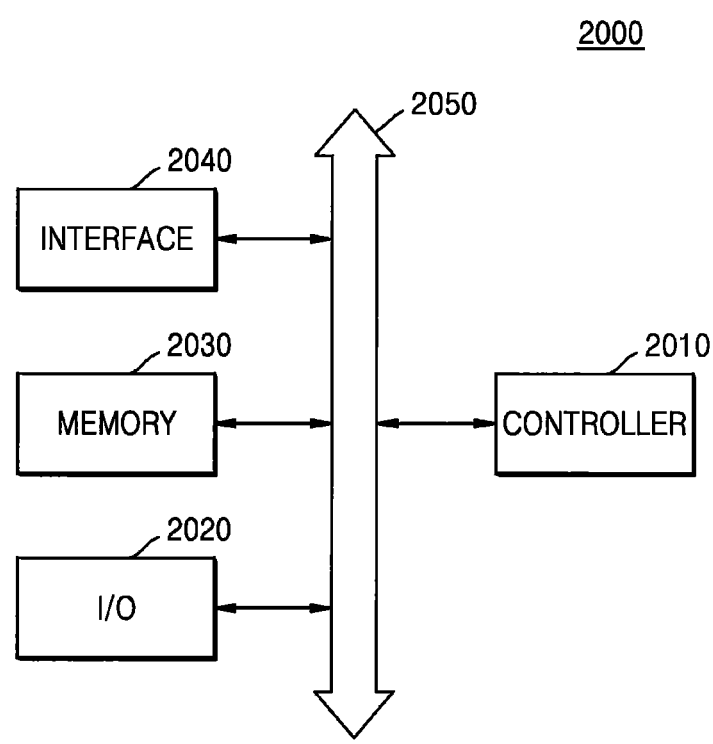
FIG. 23 is a block diagram of electronic system according to an example embodiment of the inventive concepts.

FIG. 23 is a block diagram of an electronic system 2000 according to an example embodiment of the inventive concepts.

The electronic system 2000 may include a controller 2010, an input/output (I/O) device 2020, a memory 2030, and an interface 2040, which may be connected to one another via a bus 2050.

The controller 2010 may include at least one selected from a microprocessor, a digital signal processor, and a processor similar to the microprocessor and the digital signal processor. The I/O device 2020 may include at least one of a keypad, a keyboard, and a display. The memory 2030 may be used in storing a command executed by the controller 2010. For example, the memory 2030 may be used to store user data.

The electronic system 2000 may be configured as a wireless communication apparatus or an apparatus capable of transmitting and/or receiving information under a wireless communication environment. In order for the electronic system 2000 to transmit or receive data over a wireless communication network, the interface 2040 may be a wireless interface. The interface 2040 may include an antenna and/or a wireless transceiver. In some embodiments, the electronic system 2000 may be used in a communication interface protocol of a $3^{rd}$ generation communication system such as a code division multiple access (CDMA), global system for mobile communications (GSM), North American digital cellular (NADC), extended-time division multiple access E-TDMA, and/or wide band code division multiple access (WCDMA). The electronic system 2000 may include at least one of the integrated circuit devices 100, 200, 300, and 400 according to the example embodiments of the inventive concepts described with reference to FIGS. 1A through 16B or at least one of integrated circuit devices modified or changed from the integrated circuit devices 100, 200, 300, and 400.

While the inventive concepts have been particularly shown and described with reference to example embodiments thereof, it will be understood that various changes in form and details may be made therein without departing from the spirit and scope of the following claims.

What is claimed is:

1. A method of manufacturing an integrated circuit device, the method comprising:
 forming a first fin-type active region and a second fin-type active region, the first fin-type active region disposed in a first region of a substrate and having a first n-type channel region, the second fin-type active region disposed in a second region of the substrate and having a second p-type channel region; and
 forming a first device isolation layer comprising a first insulating liner and a second device isolation layer comprising a second insulating liner and a third insulating liner, the first device isolation layer covering both sidewalls of the first fin-type active region, the second device isolation layer covering both sidewalls of the second fin-type active region,
 wherein the first device isolation layer and the second device isolation layer are formed to have different stack structures, and
 wherein the first fin-type active region comprises a pair of first fin-type active regions that are aligned in a first substantially straight line that extends in a first direction in the first region of the substrate, the method further comprising:
 forming a third device isolation layer extending in a second direction in a first space between the pair of first fin-type active regions.

2. The method of claim 1, wherein the forming of the first device isolation layer comprising the first insulating liner and the second device isolation layer comprising the second insulating liner and the third insulating liner comprises:
 forming a first trench defining the first fin-type active region in the first region and a second trench defining the second fin-type active region in the second region;
 forming the first insulating liner and the second insulating liner, the first insulating liner contacting a sidewall of the first fin-type active region in the first trench, the second insulating liner contacting a sidewall of the second fin-type active region in the second trench;
 forming the third insulating liner covering the second insulating liner in the second trench in the second region; and
 forming a first gapfill insulating layer and a second gapfill insulating layer, the first gapfill insulating layer filling the first trench on the first insulating liner, the second gapfill insulating layer filling the second trench on the third insulating liner.

3. The method of claim 2, wherein the forming of the first insulating liner and the second insulating liner is performed by using an in-situ steam generation (ISSG) process, a thermal oxidation process, an ultraviolet (UV) oxidation process, or an $O_2$ plasma oxidation process, and the forming of the first gapfill insulating layer and the second gapfill insulating layer is performed by using a flowable chemical vapor deposition (FCVD) process or a spin coating process.

4. The method of claim 2, wherein each of the first and second insulating liners comprises an oxide film, and the third insulating liner comprises a polysilicon film or a nitride film.

5. The method of claim 2, further comprising:
 performing a heat-treatment process on the first device isolation layer that shrinks at least a portion of the first gapfill insulating layer.

6. The method of claim 1, wherein the second fin-type active region comprises a pair of second fin-type active regions that are aligned in a second substantially straight line that extends in the first direction in the second region of the substrate, the method further comprising:
 forming a fourth device isolation layer extending in the second direction in a second space between the pair of second fin-type active regions,
 wherein the third device isolation layer and the fourth device isolation layer have different stack structures.

7. A method of manufacturing an integrated circuit device, the method comprising:
 forming a pair or first fin-type active regions and a pair of second fin-type active regions, the pair of first fin-type active regions being lined up in a substantially straight line along a first direction in a first region of a substrate and having a first conductive type channel region, the pair of second fin-type active regions being lined up in a substantially straight line along the first direction in a second region of the substrate and having a second conductive type channel region;
 forming a low level first device isolation layer and a low level second device isolation layer, the low level first device isolation layer covering both sidewalls of a lower portion of each of the pair of first fin-type active regions, the low level second device isolation layer covering both sidewalls of a lower portion of each of the pair of second fin-type active regions, wherein the low level first device isolation layer and the low level second device isolation layer have different stack structures; and forming a high level first device isolation layer and a high level second device isolation layer, the high level first device isolation layer extending in a space between the pair of first fin-type active regions, the high level second device isolation layer extending in a space between the pair of second fin-type active regions, wherein the high level first device isolation layer and the high level second device isolation layer have different stack structures.

8. The method of claim 7, wherein the forming of the low level first device isolation layer and the low level second device isolation layer comprises:

forming a first trench extending in the first direction in the first region and a second trench extending in the first direction in the second region;

forming a first insulating liner and a second insulating liner, the first insulating liner contacting a sidewall of each of the pair of first fin-type active regions in the first trench, the second insulating liner contacting a sidewall of each of the pair of second fin-type active regions in the second trench;

forming a third insulating liner covering the second insulating liner in the second trench; and forming a first gapfill insulating layer on the first insulating liner and a second gapfill insulating layer on the third insulating liner, the first gapfill insulating layer filling the first trench, the second gapfill insulating layer filling the second trench.

9. The method of claim 7, wherein the forming of the high level first device isolation layer and the high level second device isolation layer comprises:

forming a first fin isolation trench and a second fin isolation trench, the first fin isolation trench extending in a second direction intersecting the first direction in the first region, the second fin isolation trench extending in the second direction in the second region;

forming a first insulating liner and a second insulating liner, the first insulating liner contacting each of the pair of first fin-type active regions in the first fin isolation trench, the second insulating liner contacting each of the pair of second fin-type active regions in the second fin isolation trench;

forming a third insulating liner covering the second insulating liner in the second fin isolation trench; and forming a first gapfill insulating layer on the first insulating liner and a second gapfill insulating layer on the third insulating liner, the first gapfill insulating layer filling the first fin isolation trench, the second gapfill insulating layer filling the second fin isolation trench;

forming a first upper trench, which communicates with the first fin isolation trench and has a bottom at a level which is lower than those of upper surfaces of the pair of first fin-type active regions, by removing a portion of each of the pair of first fin-type active regions;

forming a second upper trench, which communicates with the second fin isolation trench and has a bottom at a level which is lower than those of upper surfaces of the pair of second fin-type active regions, by removing a portion of each of the pair of second fin-type active regions; and forming a first upper buried layer filling the first upper trench and a second upper buried layer filling the second upper trench.

10. The method of claim 9, wherein the first upper buried layer is formed to have an upper surface at a level that is higher than the upper surfaces of the pair of first fin-type active regions, and the second upper buried layer is formed to have an upper surface at a level that is higher than the upper surfaces of the pair of second fin-type active regions.

11. The method of claim 9, wherein the forming of the first insulating liner and the second insulating liner comprises forming an oxide film, and the forming of the third insulating liner comprises forming a polysilicon film or a nitride film.

12. The method of claim 7, further comprising forming at least one first normal gate on a first fin-type active region of the pair of first fin-type active regions and a first dummy gate on the high level first device isolation layer, the at least one first normal gate extending in a direction intersecting with an extending direction of the pair of first fin-type active regions, the first dummy gate extending parallel to the at least one first normal gate.

13. The method of claim 7, further comprising forming at least one second normal gate on a second fin-type active region of the pair of second fin-type active regions and a second dummy gate on the high level second device isolation layer, the at least one second normal gate extending in a direction intersecting with an extending direction of the pair of second fin-type active regions, the second dummy gate extending parallel to the at least one second normal gate.

* * * * *